(12) United States Patent
Phelps et al.

(10) Patent No.: US 10,767,453 B2
(45) Date of Patent: Sep. 8, 2020

(54) ADDRESSABLE SWITCH ASSEMBLY FOR WELLBORE SYSTEMS AND METHOD

(71) Applicant: GEODYNAMICS, INC., Millsap, TX (US)

(72) Inventors: Phillip Phelps, Fort Worth, TX (US); Brad Perry, Santo, TX (US); Rick Wallace, Azle, TX (US)

(73) Assignee: GEODYNAMICS, INC., Millsap, TX (US)

( * ) Notice: Subject to any disclaimer, the term of this patent is extended or adjusted under 35 U.S.C. 154(b) by 0 days.

(21) Appl. No.: 16/419,306

(22) Filed: May 22, 2019

(65) Prior Publication Data

US 2019/0309608 A1 Oct. 10, 2019

Related U.S. Application Data

(63) Continuation of application No. 16/462,648, filed as application No. PCT/US2018/022846 on Mar. 16, 2018.

(Continued)

(51) Int. Cl.
*E21B 43/1185* (2006.01)
*H01R 12/71* (2011.01)
(Continued)

(52) U.S. Cl.
CPC ............ *E21B 43/1185* (2013.01); *F42D 1/05* (2013.01); *H01R 12/714* (2013.01); *H05K 1/119* (2013.01);
(Continued)

(58) Field of Classification Search
CPC ......... E21B 43/1185; F42D 1/05; H01H 1/18; H01H 1/00; H01H 1/24; H01H 9/02;
(Continued)

(56) References Cited

U.S. PATENT DOCUMENTS 6,148,263 A 11/2000 Brooks et al.
6,283,227 B1 9/2001 Lerche et al.
(Continued)

FOREIGN PATENT DOCUMENTS

GB 2513934 A 11/2014
GB 2544247 A 5/2017

OTHER PUBLICATIONS

DYNAenergetics, "DYNAselect Electronic Detonator", 0015 SFDE RDX 1.4B, Apr. 3, 2012, retrieved from Internet on May 21, 2019: https://www.dynaenergetics.com/products/energetics-systems/initiating-systems/dynaselect.

(Continued)

*Primary Examiner* — Daniel P Stephenson
(74) *Attorney, Agent, or Firm* — Patent Portfolio Builders PLLC

(57) ABSTRACT

A downhole system includes a controller located at the surface, a gun string located in a wellbore, the gun string including plural gun assemblies, a thru-line connecting the controller to the gun string, and a detonator block attached to a given gun assembly. The detonator block includes an addressable switch assembly. The gun assembly includes an end plate mechanism that electrically connects to the detonator block. The detonator block has at least one spring-loaded contact connected to the thru-line and the end plate mechanism includes a round electrical contact made as a printed circuit board, and the spring-loaded contact touches the printed circuit board.

15 Claims, 13 Drawing Sheets

Related U.S. Application Data

(60) Provisional application No. 62/620,588, filed on Jan. 23, 2018.

(51) Int. Cl.

| | | |
|---|---|---|
| H05K 1/11 | (2006.01) | |
| F42D 1/05 | (2006.01) | |
| H01R 13/08 | (2006.01) | |
| H01H 1/18 | (2006.01) | |
| H01H 1/24 | (2006.01) | |
| H01H 9/02 | (2006.01) | |

(52) U.S. Cl.
CPC ............... *H01H 1/18* (2013.01); *H01H 1/24* (2013.01); *H01H 9/02* (2013.01); *H01R 13/08* (2013.01); *H05K 2201/09027* (2013.01); *H05K 2201/09445* (2013.01); *H05K 2201/09809* (2013.01)

(58) Field of Classification Search
CPC ...... H01R 12/714; H01R 13/08; H05K 1/119; H05K 1/11; H05K 2201/09027; H05K 2201/0939; H05K 2201/09445; H05K 2201/09809

See application file for complete search history.

(56) References Cited

U.S. PATENT DOCUMENTS

| | | |
|---|---|---|
| 6,604,584 B2 | 8/2003 | Lerche et al. |
| 6,837,310 B2 | 1/2005 | Martin |
| 6,938,689 B2 | 9/2005 | Farrant et al. |
| 7,007,756 B2 | 3/2006 | Lerche et al. |
| 7,116,542 B2 | 10/2006 | Lerche et al. |
| 7,336,474 B2 | 2/2008 | Lerche et al. |
| 7,347,278 B2 | 3/2008 | Lerche et al. |
| 7,383,882 B2 | 6/2008 | Lerche et al. |
| 7,445,042 B2 | 11/2008 | Freer et al. |
| 7,505,244 B2 | 3/2009 | Lerche et al. |
| 7,520,323 B2 | 4/2009 | Lerche et al. |
| 7,980,309 B2 | 7/2011 | Crawford |
| 8,230,788 B2 | 7/2012 | Brooks et al. |
| 8,576,090 B2 | 11/2013 | Lerche et al. |
| 8,689,868 B2 | 4/2014 | Lerche et al. |
| 8,884,778 B2 | 11/2014 | Lerche et al. |
| 8,931,389 B2 | 1/2015 | Brooks et al. |
| 9,080,433 B2 | 7/2015 | Lanclos et al. |
| 9,464,508 B2 | 10/2016 | Lerche et al. |
| 9,581,422 B2 | 2/2017 | Preiss et al. |
| 9,689,223 B2 | 6/2017 | Schacherer et al. |
| 2005/0197781 A1 | 9/2005 | Harmon et al. |
| 2007/0125540 A1 | 6/2007 | Gerez et al. |
| 2011/0024116 A1* | 2/2011 | McCann ............ E21B 43/1185 166/297 |
| 2011/0066378 A1 | 3/2011 | Lerche et al. |
| 2013/0120112 A1 | 5/2013 | Zhao |
| 2014/0151018 A1 | 6/2014 | Lerche et al. |
| 2015/0000509 A1 | 1/2015 | Current et al. |
| 2015/0096752 A1 | 4/2015 | Burgos et al. |
| 2015/0292849 A1 | 10/2015 | Lerche et al. |
| 2019/0309608 A1* | 10/2019 | Phelps .................... H05K 1/11 |
| 2019/0323810 A1* | 10/2019 | Saltarelli .................. F42D 1/05 |

OTHER PUBLICATIONS

DYNAenergetics, "DYNAselect Electronic Detonator", 0015 SFDE RDX 1.4S, Apr. 3, 2012, retrieved from Internet on May 21, 2019: https://www.dynaenergetics.com/products/energetics-systems/initiating-systems/dynaselect.

DYNAenergetics, "Electronic Top Fire Detonator", Jul. 30, 2013, retrieved from internet on May 21, 2019: https://www.dynaenergetics.com/products/energetics-systems/initiating-systems/rf-safe-detonators.

DYNAenergetics, "Selective Perforating Switch", May 27, 2011, retrieved from internet on May 21, 2019: https://www.dynaenergetics.com/products/energetics-systems/selective-perforating.

DYNAenergetics, Dynawell, "Gun Assembly", retrieved from internet on May 21, 2019: https://www.dynaenergetics.com/products/energetics-systems/initiating-systems/dynaselect.

DYNAenergetics, DYNAselect System, retrieved from internet on May 21, 2019: https://www.dynaenergetics.com/products/hardware-and-tcp.

Hunting, "Wireline Top Fire Detonator Systems", p. 49, retrieved from internet on May 21, 2019: http://www.hunting-intl.com/titan/perforating-guns-and-setting-tools/wireline-top-fire-detonator-systems.

International Search Report and Written Opinion, dated Jul. 26, 2018, from corresponding/related International Application No. PCT/US18/22846.

Jim Giliat et al., "New Select-Fire System; Improved Reliability and Safety in Select Fire Operations", 2012.

\* cited by examiner

ADDRESSABLE SWITCH ASSEMBLY FOR WELLBORE SYSTEMS AND METHOD

BACKGROUND

Technical Field

Embodiments of the subject matter disclosed herein generally relate to downhole tools for perforating operations, and more specifically, to a gun string having one or more addressable switch assemblies for selectively activating a detonator from a plurality of detonators.

Discussion of the Background

After a well 100 is drilled to a desired depth H relative to the surface 110, as illustrated in FIG. 1, and the casing 110 protecting the wellbore 104 has been installed and cemented in place, it is time to connect the wellbore 104 to the subterranean formation 106 to extract the oil and/or gas.

The process of connecting the wellbore to the subterranean formation may include the following steps: (1) placing a plug 112 with a through port 114 (known as a frac plug) above a just stimulated stage 116, and (2) perforating a new stage 118 above the plug 112. The step of perforating is achieved with a gun string 120 that is lowered into the well with a wireline 122. A controller 124 located at the surface controls the wireline 122 and also sends various commands along the wireline to actuate one or more gun assemblies of the gun string.

A traditional gun string 120 includes plural carriers 126 connected to each other by corresponding subs 128, as illustrated in FIG. 1. Each sub 128 includes a detonator 130 and a corresponding switch 132. The detonator 130 is not connected to the through line (a wire that extends from the surface to the last gun and transmits the actuation command to the charges of the gun) until the corresponding switch 132 is actuated. The corresponding switch 132 is actuated by the detonation of a downstream gun. When this happens, the detonator 130 becomes connected to the through line, and when a command from the surface actuates the detonator 130, the upstream gun is actuated.

For a conventional perforating gun string 120, carriers 126 are first loaded with charges and a detonator cord. Gun strings are then built up, one gun assembly at a time, by connecting the loaded carriers 126 to corresponding subs 128. These subs contain the switch 132 with pressure bulkhead capabilities. Once the sub is assembled to the gun string, the wires and detonation cord are pulled through the port in the sub, allowing for the installation of the detonator, the corresponding switch, and the connection of the wirings. Those skilled in the field know that this assembly operation has its own risks, i.e., miswiring, which may render one or more of the switches and corresponding detonators unusable.

After a conventional gun string has been assembled, none of the detonators are electrically connected to the through wire or through line running through the gun string. This is because between each gun assembly there is a pressure-actuated single pole double throw (SPDT) switch. The normally closed contact on these switches connects the through wire from gun assembly to gun assembly. Once the switch has been activated by the blast of the gun assembly beneath (when that guns goes off), the switch changes its state, connecting the through wire coming from above to one lead of the detonator. The other lead of the detonator is wired to ground the entire time.

In this configuration, after assembly, it is not possible to select which switch of the plurality of switches is to be activated. Once a fire command is sent from the controller 124, the most distal switch is activated. The blast from the corresponding gun assembly then activates the next switch and so on.

U.S. Pat. No. 6,604,584 discloses a downhole activation system that uses control units having "pre-assigned identifiers to uniquely identify each of the control units," and based on these identifiers, a central controller can communicate with a selected control unit. This downhole activation system requires the central controller to interrogate, when the system is started, each control unit to determine its address. If an address has not been assigned to a control unit, the downhole activation system would assign an address to that control unit. However, this process is cumbersome and slow.

In addition, the system of U.S. Pat. No. 6,604,584 does not address how the setting tool is activated. In this regard, note that the setting tool has its own detonator and switch. Previously, the setting tool required a separate and unique addressable switch for its actuation, which further complicates the firing of the detonators.

Thus, there is a need to provide a downhole system that overcomes the above noted problems and offers the operator of the system the capability to select any of the switches present in the gun string to be able to fire a desired gun assembly and/or the setting tool.

SUMMARY

According to an embodiment, there is a method for controlling a target switch assembly in a chain of switch assemblies. The method includes distributing the chain of switch assemblies in a wellbore, placing a controller at a head of the wellbore, making a first decision, at the controller, to actuate a corresponding detonator of the target switch assembly, transmitting, from the controller to the target switch assembly, a fire command to activate the corresponding detonator, and making a second decision, locally, at the target switch assembly, to activate the detonator, after the fire command from the controller is received.

According to another embodiment, there is a switch assembly, which is part of a chain of switch assemblies, the switch assembly including a communication unit (CU) configured to receive, from an external controller, a fire command to activate a detonator and a computing core (CC) configured to locally make a decision to activate the detonator, based on (i) a measured parameter (V), (ii) a threshold value of the measured parameter (V), and (iii) the fire command.

According to yet another embodiment, there is a downhole system that includes a controller located at the surface, a gun string located in a wellbore, the gun string including plural gun assemblies, a thru-line connecting the controller to the gun string, and a detonator block attached to a given gun assembly. The detonator block includes an addressable switch assembly.

According to still another embodiment, there is a method for selectively firing a setting tool detonator and a gun assembly detonator. The method includes connecting an addressable switch assembly to the setting tool detonator and to the gun assembly detonator, placing the addressable switch assembly, the setting tool detonator, and the gun assembly detonator inside a wellbore, receiving a command at the addressable switch assembly, from a surface controller, wherein the command includes a digital address and an indicator, and firing the gun assembly detonator if the indicator has a first value and firing the setting tool detonator if the indicator has a second value, different from the first value.

According to another embodiment, there is a switch assembly, which is part of a chain of switch assemblies. The switch assembly includes a communication unit (CU) configured to receive, from an external controller, a command to activate a gun assembly detonator or a setting tool detonator and a computing core (CC) configured to locally make a decision to activate one of the gun assembly detonator or the setting tool detonator, based on (i) a measured parameter (V), (ii) a threshold value of the measured parameter (V), and (iii) the received command.

According to yet another embodiment, there is a downhole system that includes a controller located at the surface, a gun string located in a wellbore, the gun string including plural gun assemblies and a setting tool, a thru-line connecting the controller to the gun string, and at least an addressable switch assembly configured to actuate a gun assembly detonator and a setting tool detonator.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to switch assemblies located inside corresponding subs and the switch assemblies have plural switches implemented in software. However, the embodiments discussed herein are also applicable when the switch assemblies having plural switches are implemented in hardware and/or when the switch assemblies are located in another component of the gun string than the sub.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 2:
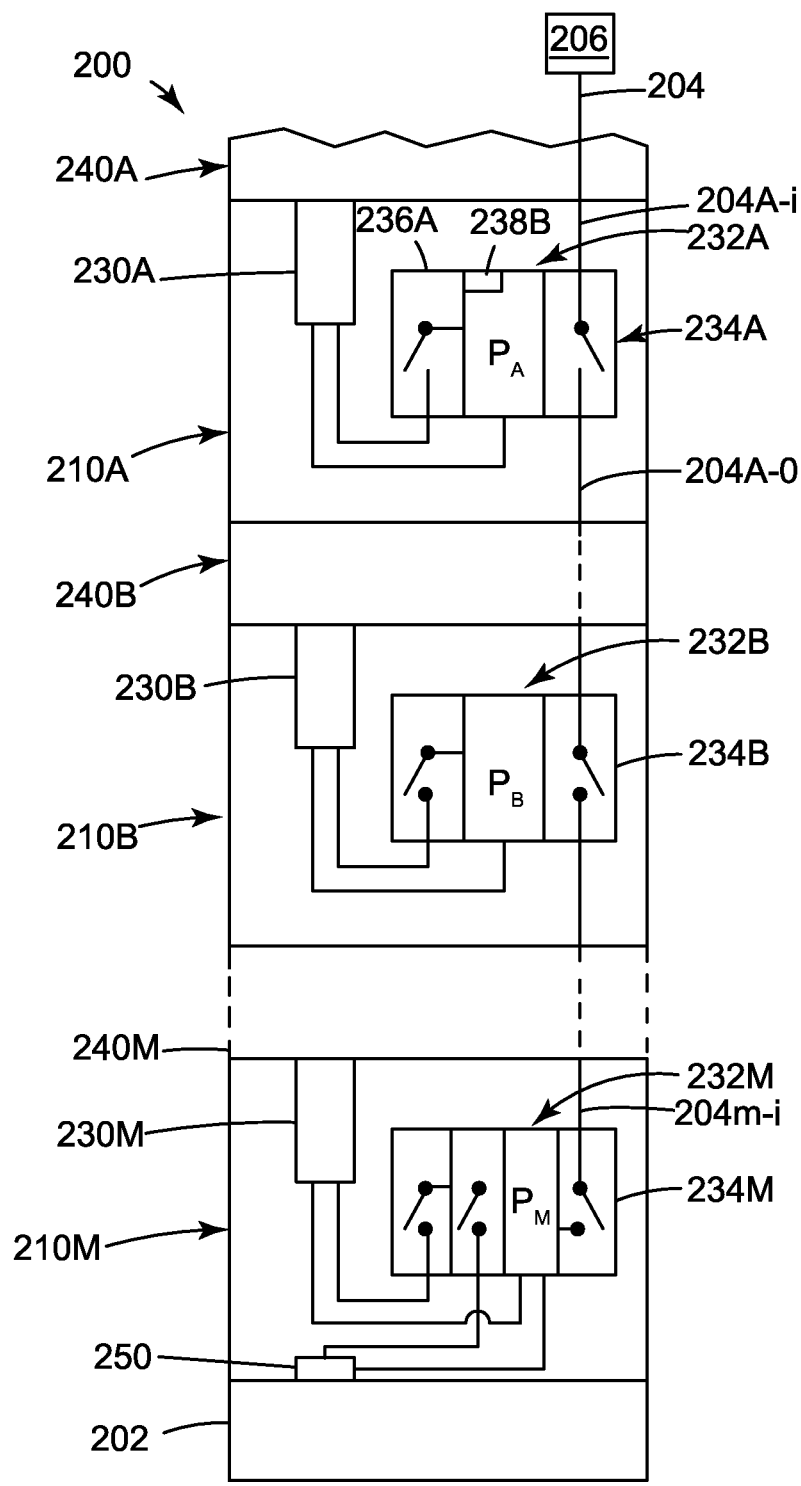
FIG. 2 illustrates a chain of addressable switch assemblies and associated gun assemblies.

According to an embodiment illustrated in FIG. 2, a gun string 200 includes plural gun assemblies 240 (shown as elements 240A to 240M, where M can take any numerical value) connected to each other through corresponding subs 210 (numbered 210A to 210M in the figure). Note that each gun assembly (except for the upper gun assembly 240A and the lower gun assembly 240M) is sandwiched by two subs. The upper gun assembly 240A is considered to be the gun assembly first connected to the wireline (not shown in FIG. 2) and the lower gun assembly is considered to be the gun most distal from the wireline, i.e., the gun assembly that is connected to the tool setting 202.

Plural switch assemblies 232A to 232M and plural detonators 230A to 230M are distributed along the gun string 200. In this embodiment, each sub 210 includes a corresponding switch assembly and a detonator, i.e., sub 210A includes switch assembly 232A and detonator 230A. The same is true for all other subs. Note that it is possible to have a gun string that has no sub. In this case, the switch assembly and the detonator are located in corresponding gun assemblies 240A. Detonator 230A is electrically connected to switch assembly 232A and ballistically connected the corresponding gun assembly 240A. The same is true for the other gun assemblies, detonators and switch assemblies.

The switch assembly 232A (in the following, reference is made to a particular switch assembly, but it should be understood that this description is valid for any switch assembly in the chain of switch assemblies shown in FIG. 2) includes a processor $P_A$ (e.g., application-specific integrated circuit or field-programmable gate array or equivalent semiconductor device) that is electrically connected to two switches. A first switch is the thru-line switch 234A, which may be implemented in software, e.g., firmware, or hardware or a combination of both. The thru-line switch 234A is connected to a thru-line 204. The thru-line switch 234A is controlled in this embodiment by the processor $P_A$. The thru-line 204 may extend from a surface controller 206 along the wireline. The portion of the thru-line 204 that enters the switch assembly 232A is called herein the input thru-line 204A-i and the portion that leaves the switch assembly 232A is called the output thru-line 204A-o. When the thru-line switch 234A is open, power or other signals send from the controller 206 cannot pass through the switch assembly 232A, to the next switch assembly 232B. By default, all the thru-line switches 234A to 234M are open.

In this embodiment, controller 206 can send not only commands, but can apply various voltages to the thru-line 204. This embodiment shows only a single line (the thru-line 204) extending from the controller 206 to the lower thru-line switch 234M. However, those skilled in the art would understand that more than one wire may extend from the controller 206 to the various switch assemblies. For example, a ground wire may extend in parallel to the thru-line. In this embodiment, the ground wire's role is performed by the casing of the gun assembly.

The switch assembly 232A also includes a detonator switch 236A, which is also controlled by processor $P_A$. The detonator switch 236A may be implemented similar to the thru-line switch 234A. The detonator switch 236A is by default open, and thus, no controlling signal is transmitted from the controller 206 or the processor $P_A$ to the corresponding detonator 230A. The switch assembly 232A may also include a memory 238A (e.g., EPROM memory) for storing a digital address.

The digital address of a switch assembly may be assigned in various ways. For example, it is possible that all the switch assemblies have a pre-assigned address. In one application, it is possible that the switch assemblies have random addresses, i.e., addresses either assigned by the manufacturer of the memory or addresses that happen to be while the memories were manufactured. In still another embodiment, it is possible that a set of predetermined addresses were assigned by the manufacturer of the gun string.

Figure 1:
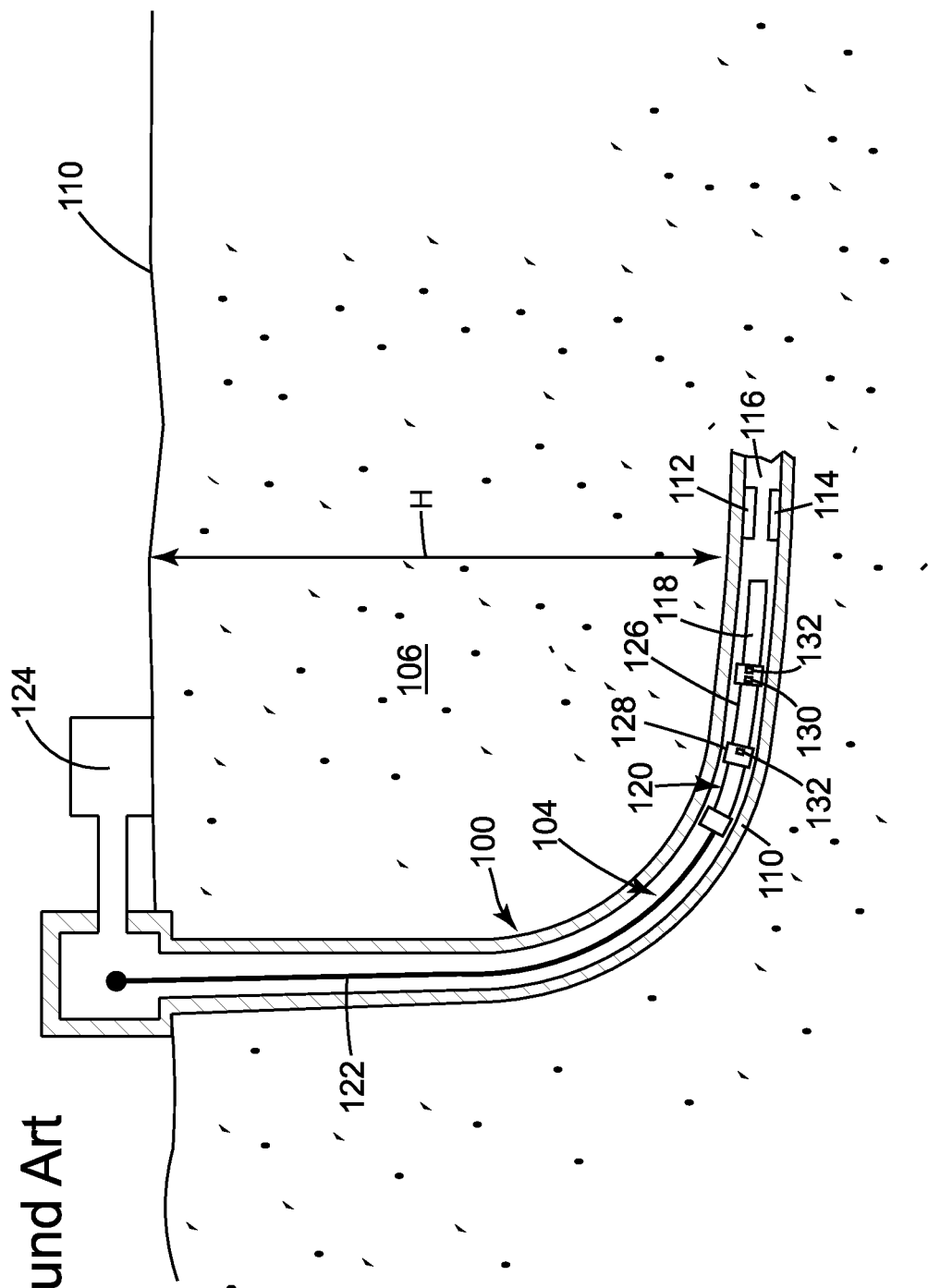
FIG. 1 illustrates a well and associated equipment for well completion operations.

The lower switch assembly 234M is different from the other switch assemblies in the sense that the switch assembly 234M is also connected, in addition to the input thru-line 204M-i and to the detonator 230M, to a setting tool detonator 250. The setting tool detonator 250 may have the same configuration as the detonator 230M, but it is used to actuate the setting tool 202. The setting tool 202 is used to set the plug 112 (see FIG. 1). Thus, the lower switch assembly needs to distinguish between two modes: (1) firing the gun detonator 230M or (2) firing the setting tool 202. A method for achieving these results is discussed later.

Figure 3A:
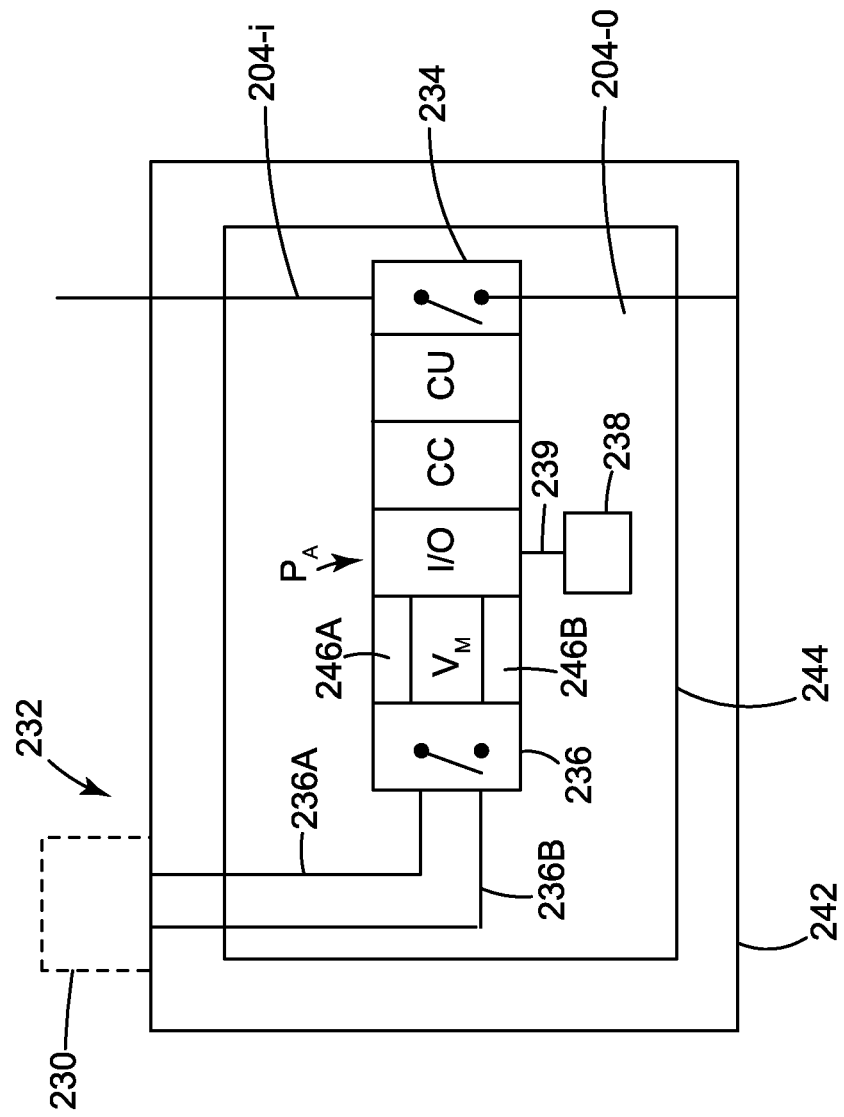
FIGS. 3A and 3B illustrate possible configurations of an addressable switch assembly.
Figure 3B:
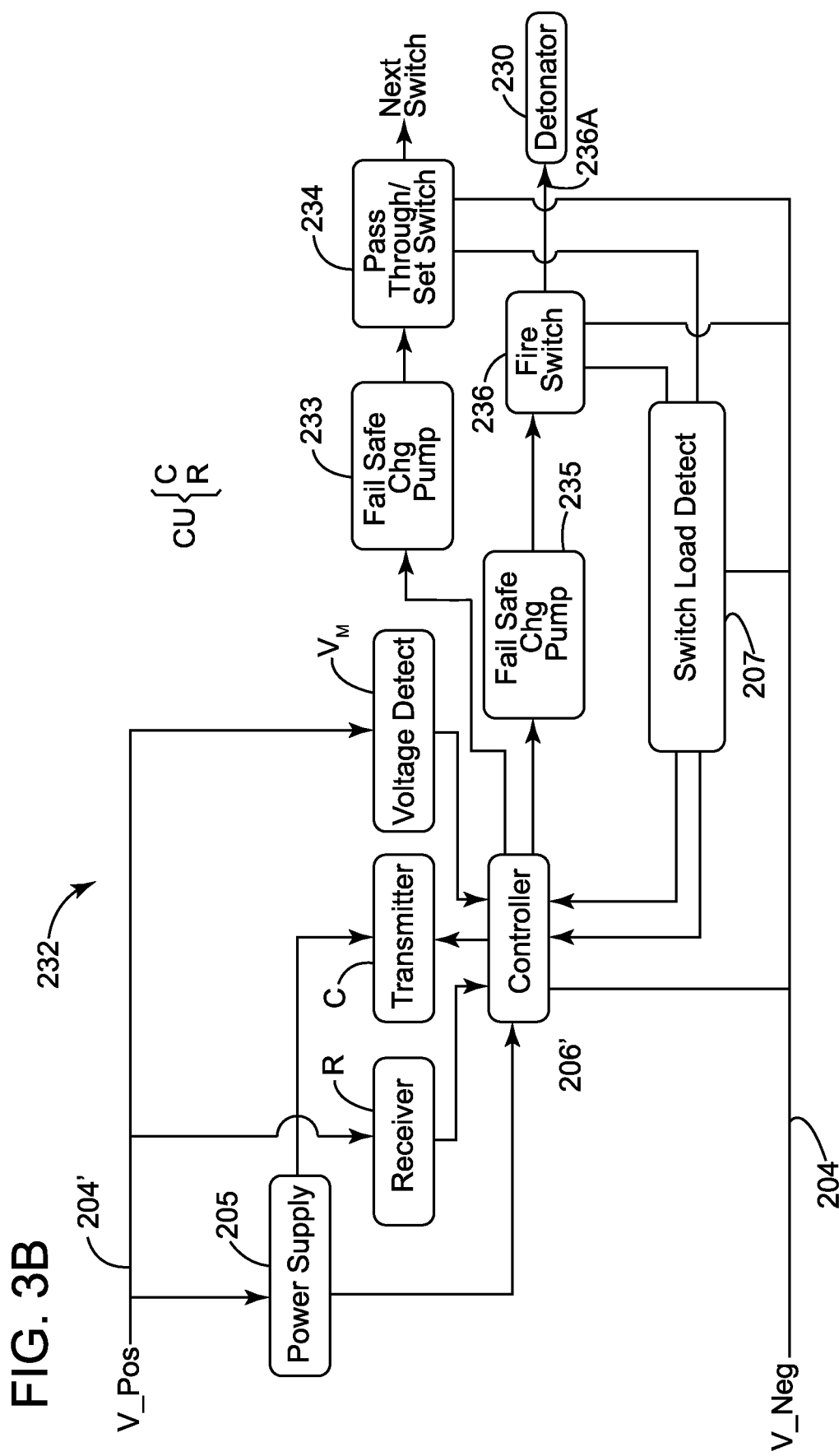

A configuration of a switch assembly 232 (which can be any of the switch assemblies 232A to 232M discussed with regard to FIG. 2) is illustrated in more detail in FIGS. 3A and 3B. Switch assembly 232 includes the thru-line switch 234 and the detonator switch 236. As discussed above, these two switches may be implemented in hardware (e.g., with semiconductor devices that may include one or more diodes and/or transistors) or in software or both. In this embodiment, it is assumed that the two switches are implemented in software (i.e., in the processor $P_A$). In this case, the two switches 234 and 236 in FIGS. 3A and 3B are logical blocks that describe the functionality performed by these switches and also their connections to other elements. This means that these logical blocks are physically implemented in processor $P_A$.

Processor $P_A$ may also include a logical voltage measuring block $V_M$ that is configured to measure a voltage present in the thru-line 204, or more specifically, the input thru-line 204-i. Further, the processor may include a logical block I/O that exchanges various input and output commands with the controller 206 through the thru-line 204. Logical block I/O may also communicate with the voltage measuring block $V_M$ for receiving the measured voltage V and providing this value to the computing core CC of the processor for performing various calculations. Processor $P_A$ is connected to the memory 238 via a bus 239. Computing core CC is capable of storing and/or retrieving various data from the memory 238 and performing various calculations. In one embodiment, memory 238 is an erasable programmable read-only memory (EPROM), which is a type of memory chip that retains its data when its power supply is switched off. This type of memory has the advantage of retaining an address associated with the switch assembly when no power is supplied. Regarding power, it is noted that in this embodiment the switch assembly receives its power along the thru-line 204, i.e., there is no local power supply in the switch assembly or the sub.

The processor $P_A$ may further include a communication unit CU that is configured to exchange data with the controller 206. As will be discussed later, various commands are sent by the controller 206 to a given switch assembly. The communication unit CU intercepts those commands (which are sent along the thru-line 204) and determines, in collaboration with the computing core CC whether the commands are addressed to the specific switch assemblies. The communication unit CU is also configured to send an address (the digital address of the switch assembly, which is stored in the memory 238) of the switch assembly to the controller 206 upon a powering operation of the switch assembly. The communication unit CU may be configured to use any known communication protocol. The communication unit CU may be implemented in software, as a logical block in the processor $P_A$, as illustrated in FIG. 3A. However, the communication unit may also be implemented as dedicated hardware or a combination of hardware and software. For example, FIG. 3B shows the communication unit CU being implemented as a receiver R and a transmitter T. FIG. 206 also shows a local controller 206'.

The processor $P_A$ may further include one or more timers. FIG. 3A shows a first timer 246A and a second timer 246B. These timers may be implemented in software, and thus the blocks labeled 246A and 246B in FIG. 3A describe logical blocks associated with these timers. These timers may be implemented in controller 206' in the embodiment illustrated in FIG. 3B. However, in one embodiment, these timers may be implemented as dedicated hardware in combination or not with appropriate software. Although FIG. 3A shows two timers, one skilled in the art would understand from this description that only one timer may be used or more than two timers. The timers are configured to count a given time interval. For example, the first timer 246A may count down from 20 s while the second timer 246B may count down from 1 s. Other values may be used. Once the given time intervals have lapsed, the timers send a message to the processor indicating this fact. As will be discussed later, these timers may be used for implementing safety procedures regarding the firing of a detonator.

FIG. 3A further shows two wires (fire wires) 236A and 236B being connected to the detonator switch 236. The embodiment of FIG. 3B uses only a single wire 236A for connecting the detonator switch 236 to the detonator 230. These two wires in FIG. 3A are connected to the detonator 230, which is not part of the switch assembly 232. However, one skilled in the art would understand that the detonator may be made part of the switch assembly. The elements discussed above with regard to the switch assembly 232 are located inside of a housing 242. The housing can be made of a metal, e.g., aluminum, or a composite material. In one embodiment that is discussed later, the switch assembly is located inside a detonator block, which is configured to also host the detonator. The entire switch assembly may be distributed on a printed circuit board 244, as schematically illustrated in FIG. 3A. The embodiment of FIG. 3B shows that two lines 204 and 204' are entering the switch assembly, where one line has a positive voltage and the other line has a negative voltage. The switch assembly may have a power supply 205 that supplies a DC voltage (e.g., 5 V) to the controller 206'. The embodiment shown in FIG. 3B also includes a failsafe mechanism 233 for the thru-line switch 234 and a failsafe mechanism 235 for the detonator switch 236. A switch load detect unit 207 detects whether one of the switches 234 or 236 has failed. If the answer is yes, the switch load detect unit 207 reports this issue to the controller 206', which instructs the corresponding failsafe mechanism 233 or 235 to respond to a pressure change in the well to open or close the corresponding switch.

The structure shown in FIG. 3A or 3B can be used for all the switch assemblies illustrated in FIG. 2, i.e., for the switch assemblies that are connected to a single detonator, but also for the lower switch assembly, which is connected to the gun detonator and the detonator of the setting tool. Previously, the setting tool required a separate and unique addressable switch for the actuation of the setting tool detonator. The switch assembly illustrated in FIGS. 3A and 3B eliminates the need for the setting tool switch, as the bottom gun addressable switch assembly's address allows that switch assembly to perform both functions of applying a shooting voltage to the detonator of the setting tool and afterwards, applying the same or a different shooting voltage to the detonator of the bottom gun.

The digital addressable switch assembly of FIG. 3A or 3B is programmed to communicate with a surface logging and/or perforating system (e.g., controller 206), which provides improved safety and perforating reliability of individual gun control from the surface. The configuration shown in FIG. 2, which includes plural addressable switch assemblies, has the ability of firing a single gun assembly, generally starting at the bottom of the gun string. It also provides for skipping any one or more gun assembly in the gun string that may be defective, thereby continuing the perforating process of firing single gun assemblies with any of the remaining gun assemblies in a string.

The switch assembly 232 may be designed to provide an exact form replacement to the EB style switches currently in use. The electronic circuit board 244 of the switch assembly 232 may be potted within the metallic housing 242 by a thermally conductive, electrically isolation epoxy that also provides both electrical and mechanical shock survivability. The construction of the switch assembly has no moving parts, making it ruggedly built to withstand the blast of the perforating gun assembly and the downhole well pressure.

In one embodiment, each switch assembly's processor and/or memory is pre-programmed with a unique digital address, which is dynamically capable of being changed in the field. Each switch assembly is positioned within a sub connected to a gun assembly to enable the firing of that specific gun assembly while maintaining pressure containment to enable the intrinsically safe arming, and shooting of a single specific gun assembly. A gun string, as discussed above, then consists of multiple pre-assembled and tested gun assemblies typically connected, end to end and lowered to the bottom of the production well. However, as discussed above, if no subs are used in a certain gun string, then the switch assemblies are positioned in other parts of the gun string.

The gun string is shot starting with the setting tool, which sets a drillable bridge plug. Before the perforation operation begins, the plug seal is hydraulically tested and afterwards the bottom gun assembly in the string is shot, followed by multiple gun assemblies being shot at pre-determined points along the course of the well bore. As each gun assembly is shot, the thru-line and electronics associated with the corresponding addressable switch assembly is destroyed by the pressure waves generated by the charges of the gun assembly. Therefore, the addressable switch assembly cannot be re-used for a second shooting. However, the mechanical housing 242 of the switch assembly 232 is configured to maintain the pressure integrity of the adjoining gun assembly and the electronic circuitry is reset to prevent voltage being applied to accidentally fire a next gun assembly.

Each switch assembly may be configured in software internal to the processor $P_A$ to provide the capability of firing a single gun assembly or, at the operator discretion, in the field, to be used as the bottom gun/setting tool switch. The lower switch assembly's fire capability is selected at the final assembly of the gun string by changing the address, for example, to a pre-determined value to enable that functionality.

Figure 4:
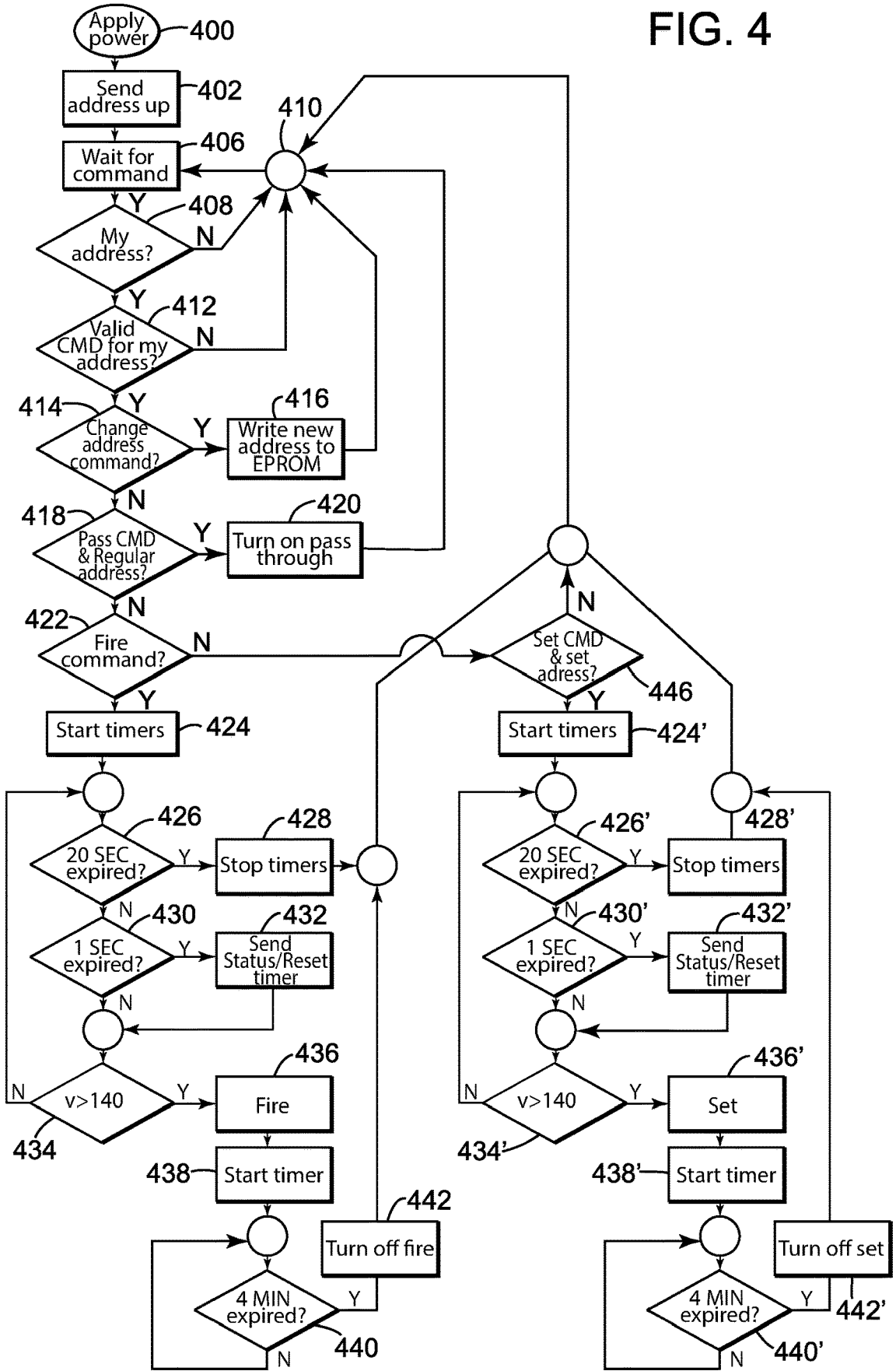
FIG. 4 is a flowchart of a method for selecting an addressable switch assembly and actuating an associated detonator.

The selection of a given switch assembly and various operations associated with the shooting of a gun assembly are now discussed with regard to FIG. 4. Suppose that the switch assemblies have been provided in the corresponding subs, and the subs have been connected to the corresponding gun assemblies so that the entire gun string is assembled. Either before the gun string is lowered into the well, or after the gun string has been deployed inside the well, power is applied in step 400 from the controller 206 (see FIG. 2) through the wireline (that includes the thru-line) to the gun string. At this time, as illustrated in FIG. 2, all the thru-line switches of the switch assemblies are open, which means that the power is received only by the upper switch assembly 232A, but not by the other switch assemblies.

Upon receiving power in step 400, the first switch assembly 232A sends in step 402 its digital address to the controller 206. This digital address, as discussed above, can be pre-assigned by the operator of the gun string before assembling the gun string, can be pre-assigned by the manufacturer of the gun string, or can be a random address that was generated when the memory 238 was manufactured. In one embodiment, the digital address can even be an incomplete address. After sending its address, the switch assembly waits in step 404 for a command from the controller 206.

Controller 206, upon receiving the digital address of the first switch assembly of the chain of switch assemblies, stores this address in an associated memory and maps the first switch assembly of the chain with this digital address. This mapping may be recorded in a table kept by the controller. The table would also include the digital addresses of all the switch assemblies in the chain, as each switch assembly is powered up.

After all the thru-line switches are closed and the controller is able to communicate with each of them, further commands are sent from the controller. When a command from the controller 206 is sent along the thru-line 204, each switch assembly intercepts that command and verifies in step 408 weather an address carried by the command matches the address of the switch assembly. If the result of this step is NO, the process advances to step 410, which returns the process to the step 406 of waiting for a command. However, if the result of step 408 is YES, i.e., the command sent by the controller 206 is intended for the given switch assembly, the process advances to step 412, where a determination is made of whether the command is valid for the given switch assembly. For example, suppose that the command includes the correct digital address of the upper switch assembly 232A, but instructs it to fire the detonator of the setting tool. As previously discussed, the setting tool is controlled by the lower switch assembly 232M, not the upper switch assembly 232A. In this case, step 412 determines that the command, although addressed to the correct switch assembly 232A, it not valid for this switch assembly. Thus, the process is returned to step 406 for waiting for another command.

However, if the received command has the right digital address and is a valid command for the switch assembly 232A, then the process advances to step 414. In step 414, the processor of the switch assembly determines whether the command is related to changing an address of the switch assembly. If the result of this determination is yes, then the process advances to step 416 during which the original digital address of the switch assembly is replaced with a new one selected by the operator of the chain. In other words, according to this step, the operator dynamically assigns new addresses to the switch assemblies of the chain. If a new address has been assigned in step 416, the new address is written to the memory 238 and then the process returns via step 410 to the waiting step 406. Alternatively, if the original address of the switch assembly is incomplete, using the process described above, the operator is able to complete the address.

If the command from the controller 206 is not related to assigning a new digital address, the processor $P_A$ checks in step 418 whether the command is related to a "pass" command. A pass command is designed to close the thru-line switch 234A so that power can be supplied to the next switch assembly 232B. If this is the case, then in step 420 the processor $P_A$ closes the switch 234A and the process returns to the waiting step 406.

If the command received in step 418 is not a pass command, then the process advances to step 422, where it is determined whether the command send by the controller 206 is a "fire" command. A fire command instructs the switch assembly to close the detonator switch for firing the corresponding detonator. If the command in step 422 is a fire command, then the process advances to step 424, at which point the first timer 246A is started. The first timer 246A may be programmed to count down a first time interval, e.g., a 20 s period. Other time periods may be used. The processor checks in step 426 whether the time period has elapsed. If the answer is yes, then the process stops in step 428 the first timer (and other timers if they have been started) and returns to the waiting step 406.

A second timer 246B may also be started in step 424. Starting this second timer is optional. If this second timer is present and started, then it counts down a second time interval, shorter than the first time interval of the first timer. In one application, the second time interval is about 1 s. When the processor determines in step 430 that the second time interval has lapsed, the processor sends in step 432 the status of the switch assembly (e.g., whether the switches are closed or open, whether a voltage has been measured, etc.) back to the controller 206. Further, in the same step 432, the second timer is reset to count down again the second time interval.

The purpose of these two counters is now explained. Returning to step 422, assume that a fire command has been send from the controller 206 to the switch assembly 232A. To actually fire the detonator associated with this switch assembly, it is not enough to only send the fire command (first condition) because that command may be send in error. Thus, a second condition needs to happen in order to actuate the detonator. This second condition is the detection in step 434 of a parameter (e.g., voltage) characterizing the thru-line 204 and determining whether a value of this parameter is larger than a given threshold. For example, the threshold voltage can be 140 V. Other values may be used. Note that a voltage in the thru-line during normal operation is much less than the threshold voltage, e.g., about 30 to 40 V. Those skilled in the art would understand that other parameters than voltage may be used, for example, a given frequency.

Thus, after the fire command was received in step 422 and the first timer was started in step 424, if a voltage increase above the threshold voltage is not detected (second condition for firing) in step 434, the process returns to step 426. If the first timer has counted down the first time interval, as a safety measure, because the second condition has not been fulfilled, the process stops the timers in step 428 and returns to the waiting step 406.

While the process loops from step 434 back to step 426 and so on during the first time interval, the second timer 246B counts down the second time interval, which is much shorter than the first time interval, which results in information about the status of the switch assembly being sent in step 432 to the operator of the gun string. In this way, the operator is constantly appraised about the status of the switch assemblies.

However, if a voltage increase above the threshold voltage is detected by the voltage measurement unit $V_M$ in step 434 while the first time interval has not lapsed, then the process advances to step 436 to fire the detonator 230A. Note that different from all the existing methods in the field, the final decision to fire the detonator is made at the switch assembly level, i.e., by the processor $P_A$. In other words, while the initial decision to fire a gun assembly is made by the operator of the gun string at the controller 206, the final decision to actually fire that gun assembly is made locally, at the switch assembly (in step 434). This split decision method ensures that the initial decision was not a mistake and also prevents firing in error the detonator.

As a further safety measure (a fail-safe measure), a third timer (or the first timer) is started in step 438 and is instructed to count down a third time interval. The third time interval may be larger than the first time interval, for example, in the order of minutes. In this specific embodiment, the third time interval is about 4 min. If the detonator was actuated in step 436, as previously discussed, the detonation of the charges in the gun assembly would likely destroy the switch assembly 232A and thus the process stops here for this specific switch assembly.

However, in the eventuality that the detonator failed to actuate, for any reason, when the processor PA determines in step 440 that the third time period has elapsed, locally decides to turn off the fire process in step 442 and the process returns to the waiting step 406. The processor may also send a status report in step 442 to the controller 206 informing that the fire process has failed. Thus, the operator may decide to repeat the firing process or decide to skip the firing of this gun assembly.

The processes discussed above apply to any of the switch assemblies shown in FIGS. 3A and 3B. Once the pass command has been applied to each switch assembly, the controller 206 is capable of instructing any of the switch assemblies, irrespective of their position in the chain of switch assemblies, to fire its corresponding detonator, due to the selectivity afforded by the digital address. This feature is reflected in step 408, which checks for a match in the address sent by the controller 206 and the address of each switch assembly.

Next, the process for firing the detonator of the setting tool and not the detonator of the gun assembly associated with the lower switch assembly is discussed. If a command having the address of the lower switch assembly 232M is sent (see step 408 that verifies the address), and the command is valid (step 412), and the command is neither a change address command (see step 414) nor a pass through command (see step 418), and the command is also not a fire command (see step 422), then the processor $P_A$ determines in step 446 whether the command is associated with the detonator of the setting tool. If the answer is no, the process returns to the waiting step 406. If the answer is yes, the process advances to step 424', which is similar to step 424 discussed above, except that step 424' is applicable to the setting tool detonator 250 (see FIG. 2) associated with the setting tool 202.

The following steps 426' to 442' are similar to the corresponding steps 426 to 442 and thus, their description is omitted herein. The same safety features are implemented for the setting tool as for the gun assembly, i.e., the first to third timers. Note that actuating the detonator of the setting tool is possible only for the lower switch assembly 232M as this switch assembly is the only one that can execute a setting tool command. This is possible because the lower switch assembly 232M checks whether an indicator in the received command has a first value or a second value. The first value is associated with a fire command while the second value is associated with a setting tool command. Thus, when a command from the controller 206 is received and includes the digital address of the lower switch assembly 232M and the indicator has the first value, the processor follows steps 424 to 442. However, if the command includes the digital address of the lower switch assembly 232M and the indicator has the second value, the processor follows steps 424' to 442'.

The setting tool associated address is set up by the controller 206 in step 414. As previously discussed, each switch assembly has a complete or partial address, either pre-assigned or randomly assigned during the manufacture process of the memory. In step 414, when the controller 206 determines that the switch assembly 232M is the last one in the chain of switch assemblies, the controller 206 may assign an additional address to the lower switch assembly 232M. This additional address is directly linked to the setting tool 202 and it is checked in step 446 discussed above.

Returning to the concept of dynamic addressing a switch assembly (see steps 414 and 416 in FIG. 4), the following aspects are further discussed for clarification. According to this method, it is possible to set switch addresses in a gun string during the initial testing, after a gun string has been assembled or at any other time. The procedure of dynamic addressing may be accomplished using a test box or a control system designed for this purpose, for example, the controller 206.

In one application, upon power being applied to the chain of switch assemblies, the first switch assembly powers up, performs internal testing of its circuits, and tests for the presence of a detonator. After a short delay, it sends up this information (see step 402) to the test box with an uninitialized address. The test box will recognize this address and sends a command (see step 414) which instructs the switch assembly to reprogram its address to the one sent in the command. The test box then sends the "pass through" command in step 418. At this point, the switch assembly will "pass through" the voltage to the next switch assembly in the chain, and the process is repeated until all the switch assemblies in the chain are accounted for.

During the operation of the gun string, the surface logging and/or perforating system (i.e., controller 206) may poll the gun string. This polling process is initiated by applying power to the upper switch assembly 232A in the gun string. Upon powering up, the upper switch assembly transmits its address up the wireline and then automatically reverts to a low power listening mode state. The controller 206 receives and identifies the unique address of the switch assembly and positions this switch assembly in the gun string. Then, the controller 206 transmits a digital code (pass through command) back down-hole to the switch assembly that instructs the switch assembly to apply power to the next switch assembly in the string below.

Power is then applied to the next switch assembly down the gun string. The process is repeated for each switch assembly or any number of gun assemblies in a gun string. When the controller 206 detects the lower switch assembly in the string, a record of the number, address and position in the gun string of all the switch assemblies is recorded.

The switch assemblies have been designed with a dual purpose feature. The switch assembly can be set for (1) a normal mode fire with pass through, or (2) a setting tool mode fire. The setting tool mode can be used for a setting tool and the associated lower gun assembly. A unique address may be used to determine which mode to be used. The setting tool mode will follow the same fire procedure to set a plug as discussed above with regard to FIG. 4.

After all the switch assemblies in a gun string are powered up and all the addresses are recorded, all the switch assemblies in the gun string are in the "wait for command," low power consumption mode. The operator may then select any switch assembly in the gun string and send a "Fire Command." Note that the operator does not have to start with the lower gun assembly. With the addressable switch assemblies discussed herein, the operator has the freedom to actuate any switch assembly, wherever positioned in the chain of the switch assemblies. The unique digital address code for a specific switch assembly in the gun string is transmitted immediately followed by a unique digital coded fire command. Once the correctly addressed switch assembly understands its address code, the command initiates an internal timer (see step 424). Inside this timer loop, the switch assembly sends up the wireline a status/reset code (see step 432) at 1 second interval giving the operator a visual indication of the ready to fire state of the switch assembly. This timer loop is user programmable from 10 to 60 seconds and indicates the time remaining before the switch assembly will abort the fire command and revert back to normal operation in its previously configured state. Note that the time interval with which the one or more timers are programmed in the switch assembly may be programmed before the switch assemblies are lowered into the well, but also after they are placed inside the well (see step 414).

The switch assembly's internal voltage measurement circuits monitors the thru-line voltage. If the line voltage is increased above the threshold voltage (e.g., 140 Volts) before the first timer times out, the voltage is applied to the detonator that is hard wired to the switch assembly by closing the detonator switch. If the voltage is not increased within the time allotted by the first timer, the fire command is aborted and must be re-sent from the surface system to start another time out window. Once the voltage is above the threshold voltage and the line has been connected to the detonator, another timer (third timer, see step 438) is started. In one application, this timer is about 4 minutes and ensures that the detonator is disconnected from the line in case the detonator does not fire for any reason.

The previous embodiments discussed how various commands are sent from the controller 206 to the switch assemblies and how the switch assemblies send various information (e.g., their digital addresses or their status) to the controller. Thus, a bi-directional communication is established between the controller and the switch assemblies. One possible implementation of the various commands that are exchanged between the controller and the switch assemblies are now discussed.

According to an embodiment, communications between the controller 206 and the addressable switch assemblies is based on a frequency-shift keying (FSK) communication scheme. Binary data is encoded into the FSK scheme and the data is driven over the wireline (the thru-line), where each bit is represented by, for example, 1.5 ms of pulses. In one application, a zero is represented by 4 cycles of 2.666 kHz and a one is represented by 6 cycles of 4 kHz. These are exemplary numbers and those skilled in the art would understand that other numbers may be used. Others modulation schemes may be used for the communications between the controller and the switch assemblies.

Figure 5:
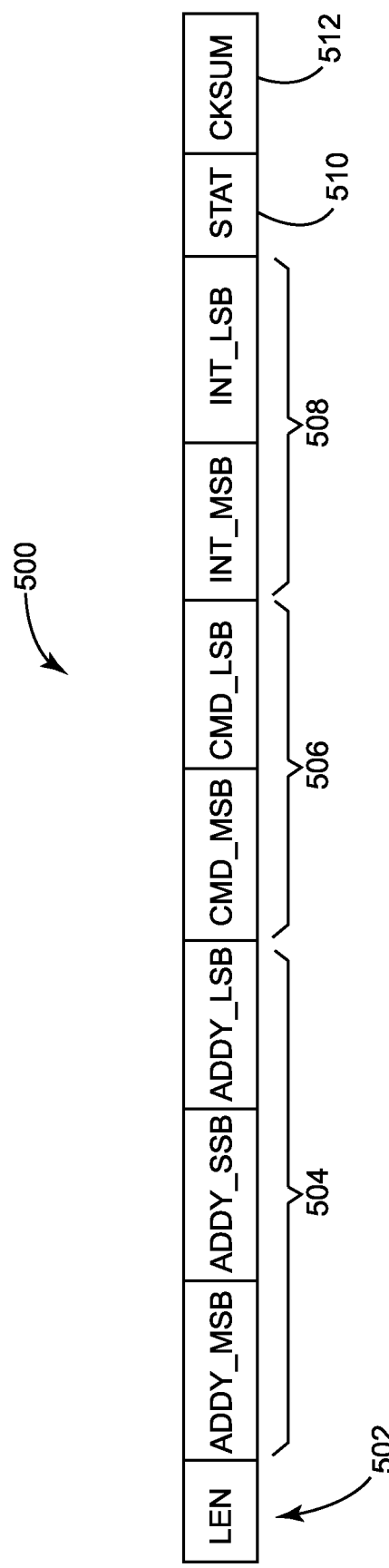
FIG. 5 illustrates a configuration of a frame that is associated with a command.

In one application, upon the initial power-up of a switch assembly, the switch assembly sends a 10-byte uplink to the surface controller to identify itself and also may send certain status information. The surface controller can then send a 10-byte downlink to the switch assembly with various commands, as outlined below. For both the uplink and downlink, the format of a frame 500 used to carry the commands may be as illustrated in FIG. 5.

The first command in a transmitted packet is LEN 502. This command will always read 0x09, as the payload length is 9 bytes. The second command is ADDY 504. This command has three bytes, and together they constitute the 24-bit address of the individual switch. This third command is CMD 506. This command is a two-byte command issued to a given switch assembly. The actions associated with the two bytes is discussed later, but may include the above discussed commands, e.g., fire, pass-thou, set. The fourth command is INT 508. This command can be used to pass switch data to the surface, for instance, to convey an (analog to digital) ADC reading of the voltage. The fifth command is STAT 510. This command is a status byte that can convey certain data via bit-flags, e.g., 1—the switch assembly function correctly, 2—the detonator gun is open, 3—the thru-line switch is open, etc. The sixth command is CKSUM 512. This command is the sum (truncated to 8-bits) of all previous bytes in the packet.

When a switch assembly is first powered, in one embodiment, a standard configuration switch assembly may send two identical uplink packets with a given (e.g., 50 ms) time gap between packets. The packet will be in the format illustrated in FIG. 5, with the INT field containing the firmware version number and the STAT field representing the status of the resistor dividers sensing the Fire and Feedthrough lines. Bits 6 and 7 of STAT represent the voltage levels on the Feedthrough and Fire voltages respectively. If a detonator is detected on the fire line, Bit 7 will be set. If termination is detected on the Feedthrough line, Bit 6 will be set.

Several of the commands to be discussed next will result in an ADC value being sent to surface in the INT field. To convert these values to an actual voltage, note that the ADC (which is part of the voltage module $V_M$ in FIG. 3A) has 4 mV/LSB (where LSB is the least significant bit) resolution and the ADC inputs are coming through a resistor divider (e.g., a/151 resistor divider). Therefore, if an ADC reading of 19 is received, the actual measured voltage is 19*(4 mV*151)=11.5 V.

In one embodiment, the commands 506 that can be sent by the controller to the switch assemblies are as follow:

(1) Pass-Through command has values in the range of 0x13 to 0xE5. This command enables the bypass line 204-o of a switch assembly (i.e., closes the thru-line switch 234);

(2) Fire command has values in the range of 0xEC to 0x64. This command enables the fire line 236A/B (i.e., closes the detonator switch 230). After sending the Fire command, the line voltage must be raised above the threshold voltage within a specific time window (default time is the first time interval in seconds), at which point this increased voltage will be dumped onto the fire line.

(3) New Address command has values in the range of 0x0D to 0x80. This command is used by the controller to set a switch assembly with a new address. The controller sends a downlink of the New Address command, with the new address in the INT and STAT positions, which will reprogram the switch assembly's address.

(4) Un-bypass command has values in the range of 0x5D to 0xA6. This command is used by the surface controller to turn of a bypass line, i.e., if a thru-line switch 234 has previously been bypassed with the Pass-Through command, this command will turn off the bypass line, i.e., will open the switch 234.

(5) Set Fire command has values in the range of 0x15 to 0x63. This command initiate the activation of the setting tool detonator. If the switch assembly has an address in the Setting Switch range, this command will enable the Fire line in order to activate the setting tool. The Voltage/window are as described above for the FIRE command.

(6) Vrail Sense command has values in the range of 0xDD to 0x65. This command reports the voltage on the thru-line with scaling as noted above.

(7) Set Sense command has values in the range of 0x41 to 0x53. In the case of a bottom switch assembly (that also serves a setting tool), this command reports the voltage on the Set/Fire line.

(8) Fire Sense command has values in the range of 0xD2 to 0xC2. In the case of a standard switch assembly, this command reports the voltage on the Fire line.

(9) FW revision command has values in the range of 0x19 to 0xEB. This command reports the current firmware revision in the INT field.

(10) Fire Time command has values in the range of 0x32 to 0x79. This command dictates the time window between sending the Fire command and when the voltage must pass the threshold voltage in order to activate the Fire line. The new time must be in a given range (e.g., 10-60 seconds) and will be sent in the STAT field.

The protocol described in this embodiment is applicable to switch assemblies used in a wireless router (WRT), a lower switch assembly (that is also connected to a setting tool) and a standard switch assembly (not connected to a setting tool). Any particular switch assembly will have an address that corresponds to its configuration/roll. In one application, the address ranges for the above noted switch assemblies may be as follows:

WRT Address Range: 0xFFFD00-0xFFFFFE, lower switch assembly Address Range: 0xFFFC00-0xFFFCFF, and standard switch assembly Address Range: 0x000000-0xFFFFBF.

The physical location of a switch assembly 232 has been assumed in FIG. 2 to be inside a sub that is associated with a gun assembly. However, it is possible to place the switch assembly at other locations along the gun string as now discussed. For example, according to an embodiment illustrated in FIG. 6, a system 600 includes a gun string 601 located in a wellbore 211. The controller 206 is located at the surface, next to the head of the wellbore 211. The thru-line 210 extends from the controller 206 to the gun string 601. The thru-line 210 may be part of a wireline. The gun string 601 includes plural subs (only two subs 610 and 620 are shown) and plural gun assemblies (only one 630 is shown) connected to each other. The last gun assembly is connected to a setting tool 202. A setting tool detonator 250 may be located either in the setting tool 202 or in an adjacent sub, gun assembly or setting tool kit. When located in the well, the first sub 610 is upstream from the gun assembly 630 and the second sub 620 is downstream.

Figure 6:
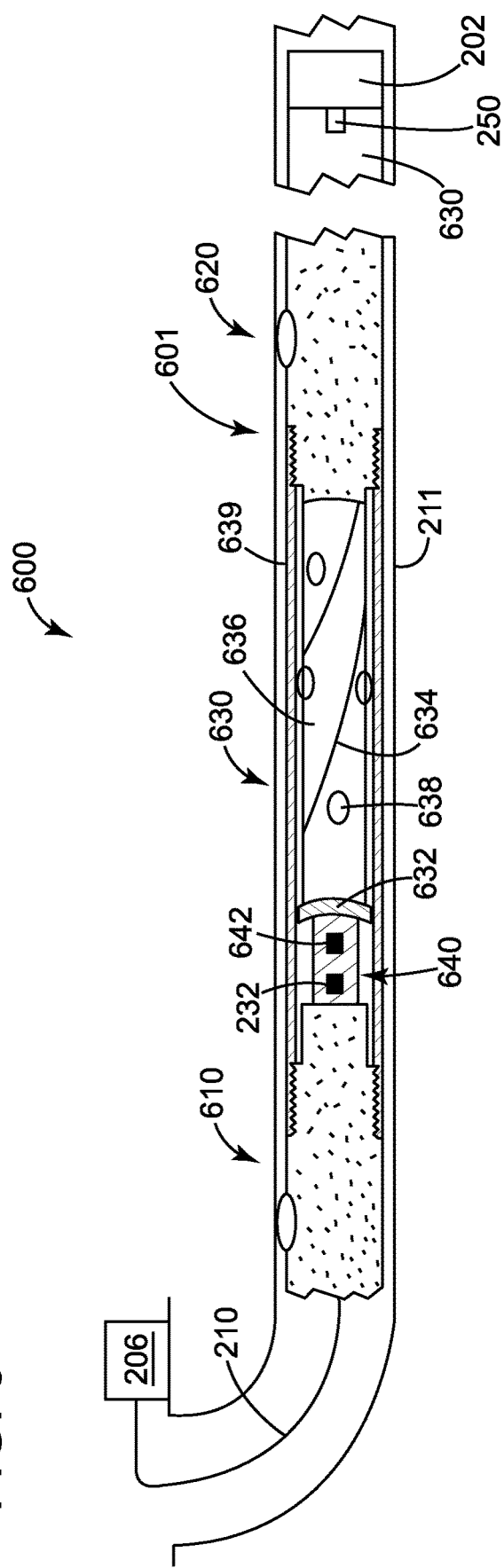
FIG. 6 illustrates a gun string having a detonator block.

While the traditional gun strings have each gun assembly directly sandwiched between two adjacent subs, according to this embodiment, there is an additional element, a detonator block 640 located between the first sub 610 and the gun assembly 630 and also a contact end plate mechanism 632 that ensures electrical connection between the detonator block 640 and the gun assembly 630. This electrical connection does not involve wires, as discussed later. A switch assembly 232 and a detonator 642 are located inside the detonator block 640. Contact end plate mechanism 632 also connects to a detonation cord 634 that actuates the charges 638 in the gun assembly 630. FIG. 6 shows the detonation cord 634 being located outside a charge load tube 636. The charge load tube 636 is configured to hold the various charges 638. FIG. 6 also shows a carrier 639 connected to the sub 610 and housing the components of the gun assembly. Each gun assembly of the gun string may be connected to a corresponding detonator block 640, that holds a corresponding switch assembly 232 and detonator 642.

Thus, according to this embodiment, neither the detonator 642 nor the switch assembly 232 are located in the sub 610 or 620 as in the traditional gun strings. This is advantageous because the repeated activation of the detonator slowly damages the sub, which is expensive to replace. However, the cost of the detonator block 640 is lower than the cost of the sub as the detonator block may be made of cheaper materials (e.g., polymers) and thus it can be changed more often. Details of the detonator block 640 and contact end plate mechanism 632 are now discussed.

Figure 7:
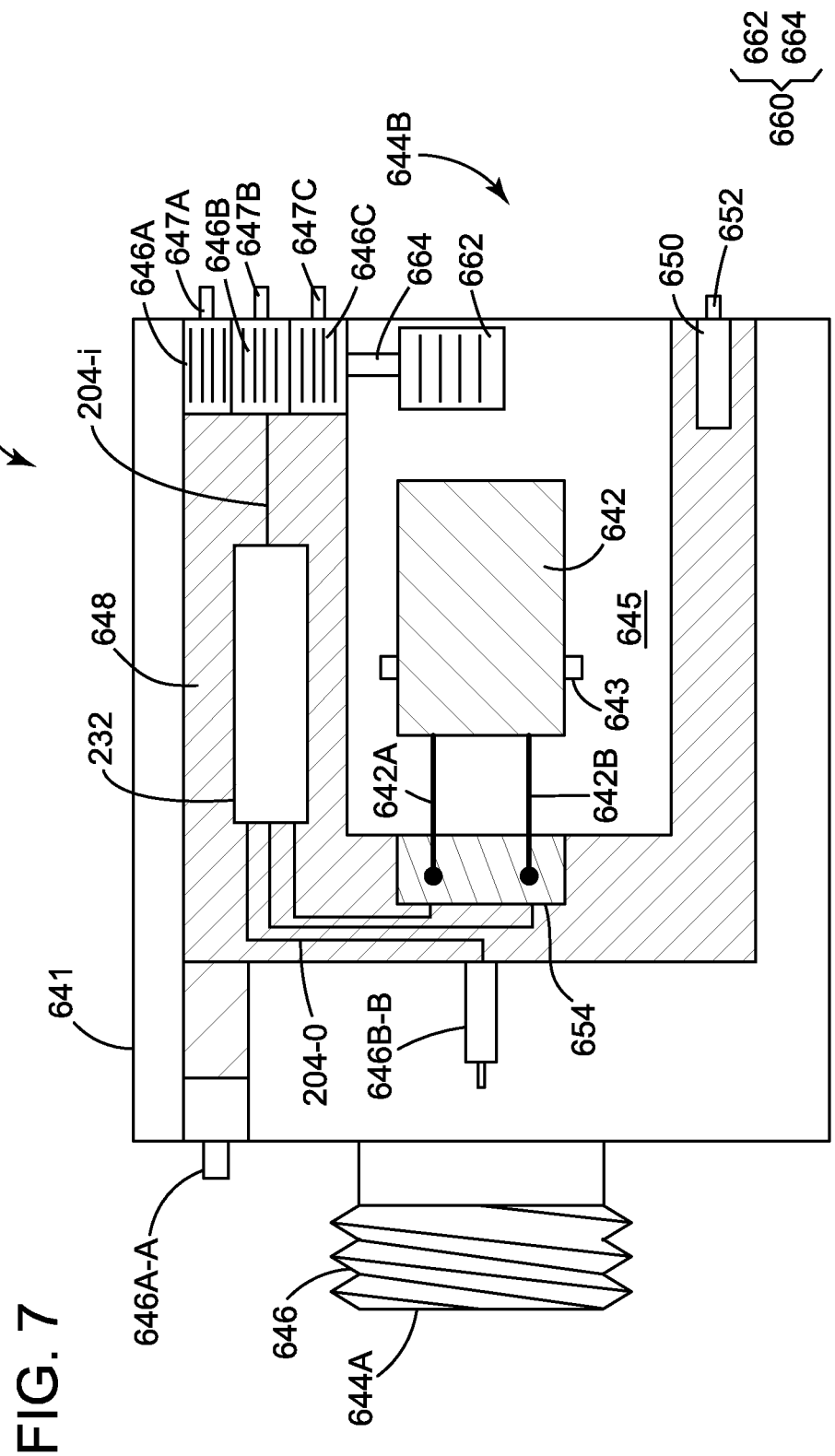
FIG. 7 illustrates an inside of the detonator block.

FIG. 7 shows a half of the detonator block 640 having the detonator 642 installed in a chamber 645 formed in a body 641 of the detonator block. Detonator 642 may be held in place by one or more holders 643 (e.g., off-the-self fuse holders). This means that any type of detonator may be placed inside the detonator block 640. A first end 644A of the body 641 is narrower than the rest of the body and has corresponding threads 646 that are designed to mate with corresponding threads in the sub 610. Note that a traditional sub 610 has a switch retainer nut that holds in place the corresponding switch. The present detonator block 640 is configured to replace the switch retainer nut in the sub 610. This means that detonator block 640 screws directly into the body of the first sub 610 when the gun string is assembled. However, only the first end 644A of the detonator block enters inside the sub, which means that the switch assembly 232 remains outside the sub.

The second end 644B of the detonator block 640 has a more complex structure. Plural spring-loaded contacts 646A to 646C (more or less contacts may be used in another embodiment) are attached to a printed circuit board (PCB) 648 and located so that corresponding pins 647A to 647C extend beyond the body 641. The PCB 648 is placed inside the detonator block. In one embodiment, the PCB 648 extends around the detonator 642 as shown in FIG. 7. The three spring-loaded contacts 647A to 646C connect to the thru-line, fire-line and dedicated ground line, respectively. As will be discussed later, these three electrical contacts connect to corresponding contacts on the contact end plate mechanism 632 discussed with regard to FIG. 6. These connectors are spring loaded to account for any variations in assembly which might otherwise prevent one of the connectors from making contact with a corresponding contact on the contact end plate mechanism.

On the same PCB 648 is located the switch assembly 232 and optionally, a contact switch 650. The switch assembly 232 has been discussed above extensively and its configuration is omitted herein. The contact switch 650 shunts the leads of the detonator 642 when the assembly is not completed. This is a safety feature which prevents an unwanted detonation of the detonator, in addition to the safety features discussed above with regard to the switch assembly 232. Note that the detonator cannot be electrically actuated as long as its leads are connected to each other. In this regard, detonator 642 has two leads 642A and 642B that are connected to a wire header 654, which is attached to the PCB 648. The two leads 642A and 642B are shorted by the contact switch 650 when a head 652 of this switch is free, i.e., not in contact with anything. As soon as head 652, which can be made of plastic, is biased by the contact end plate mechanism 632, the two leads 642A and 642B are electrically disconnected from each other. However, these leads remain connected to the rest of the circuit. Contact switch 650 may be a normally closed, momentary contact switch.

The PCB 648 electrically connects the ground contact 646A to a corresponding ground pin 646A-A and the thru-line contact 646B to the switch assembly 232. The switch assembly 232 is also connected to a corresponding thru-line pin 246B-B. The switch contact 646C may be electrically connected to a corresponding switch assembly in a downstream detonator block and also to the wire header 654 and to the contact switch 650. Pins 646A-A and 646B-B ensure that the ground-line (if present) and the thru-line continue to the next gun assembly, as illustrated in FIG. 2.

The detonator block may further include another safety feature, the interrupter mechanism 660. The interrupter mechanism 660 includes, among other elements, a cap 662 and an arm 664. Cap 662 is placed to block a ballistic connection between the detonator 642 and the detonation cord 634 of the gun assembly 630. This means that even if the detonator 642 is accidentally actuated, the produced pressure waves would not ignite the detonation cord 634 inside the gun 630, and thus, the explosive charges 638 of the gun assembly would not be actuated. Cap 662 may have the same or a larger diameter than the detonator 642 for preventing the pressure waves from the detonator to propagate downstream to the gun 630. Note that the detonator block does not have to simultaneously have all the safety features discussed herein. In one embodiment, only the safety features provided by the addressable switch assembly 232 are present. The detonator block may include any one or more of these additional safety features. In one application, the detonator block may include any combination of these safety features.

Figure 8:
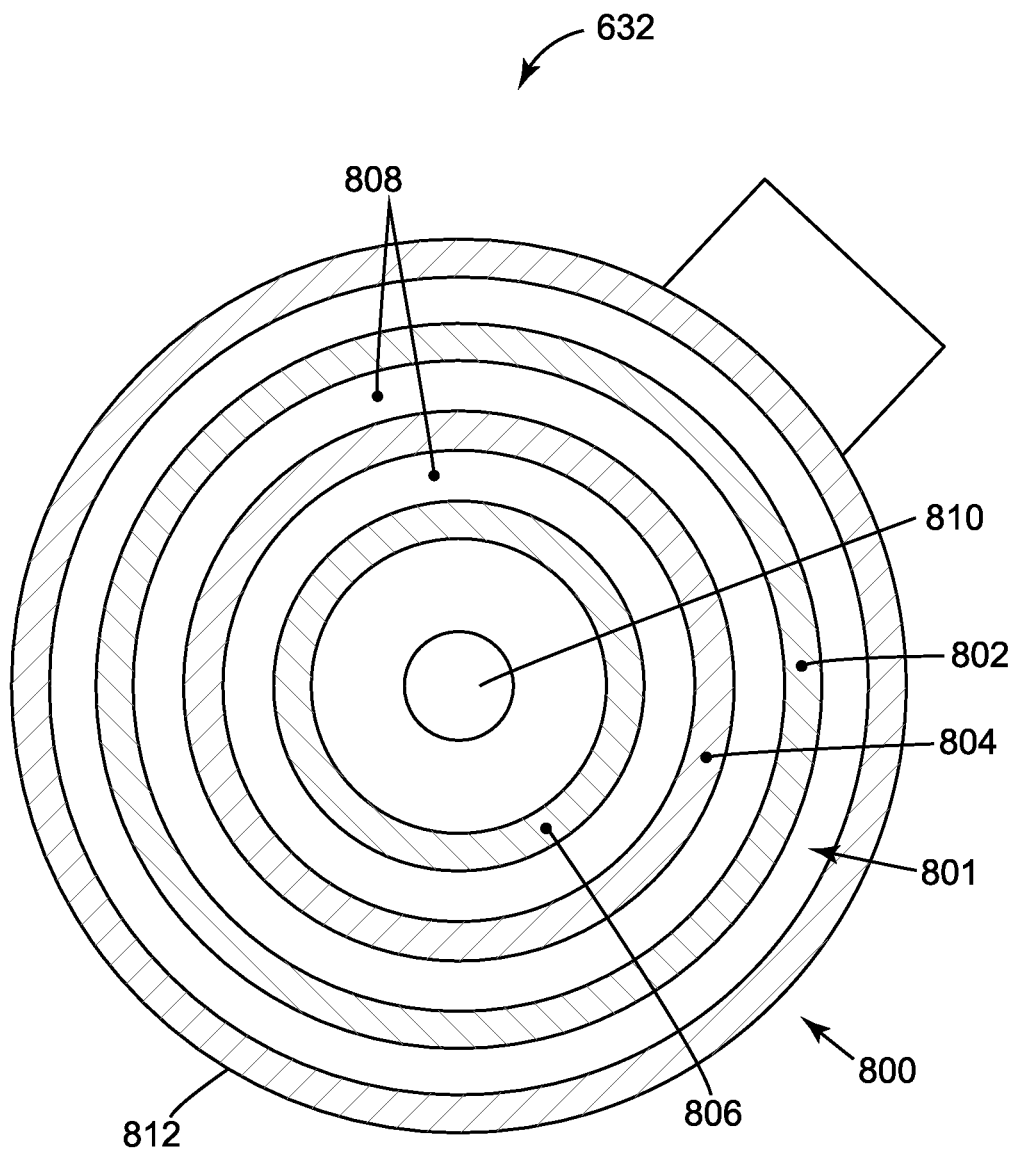
FIG. 8 illustrates a contact end plate mechanism.
Figure 9:
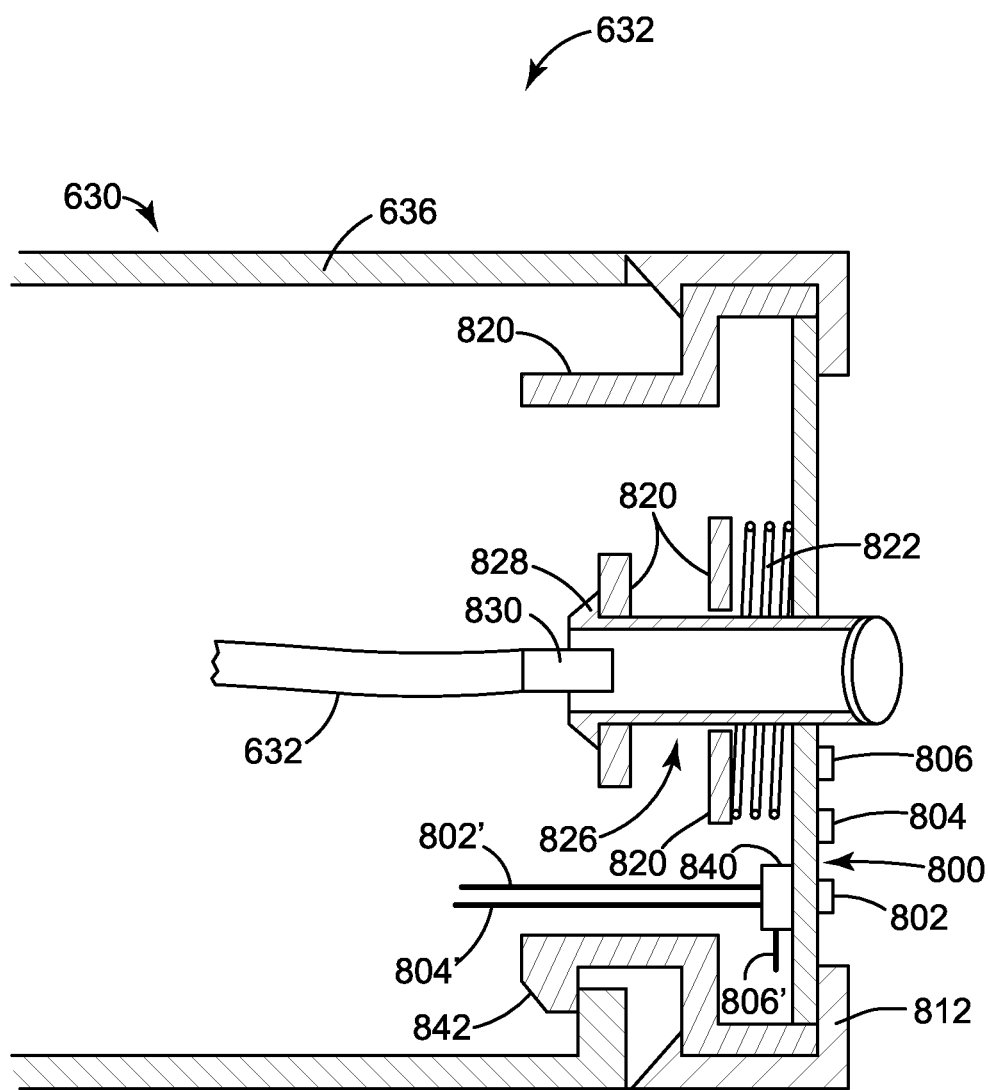
FIG. 9 illustrates various components of the contact end plate mechanism.

The configuration of the contact end plate mechanism 632 is now discussed with regard to FIGS. 8 and 9. Note that the contact end plate mechanism 632 may take the place of a conventional upstream endplate for a gun assembly. FIG. 8 shows a front face 800 of the contact end plate mechanism 632 and this front face electrically and mechanically connects to the detonator block 640. For achieving the electrical connection with the detonator block, the front face includes a printed circuit board 801 that has three electrical contacts (other number may be used in other applications) 802, 804, and 806, which are electrically separated from each other by insulating zones 808. The electrical contacts 802, 804, and 806 may be formed as rings on the printed circuit board. In one application, these electrical contacts may have another shape.

One skilled in the art would appreciate at least two advantages of these electrical contacts. First, the process of making these contacts (i.e., treating a printed circuit board to have three concentric rings) is easier and cheaper than stamping metal contacts as currently done in the industry. Second, the current guns require an accurate alignment of the various components for matching the electrical contacts of these various components. In the present embodiments, the three electrical contacts 646A, 646B, and 646C of the detonator block 640 and the corresponding three electrical contacts 802, 804, and 806 of the contact end plate mechanism 632 do not need to exactly match each other because of the circular shape of the contacts 802, 804, and 806. In other words, the electrical contacts of the detonator block may be rotated in any way relative to their longitudinal axis X and they still contact the electrical contacts of the contact end plate mechanism. Further, even if there is a gap between the detonator block and the contact end plate mechanism along the axis X, because of the springs biasing the pins of the electrical contacts of the detonator block against the contact end plate mechanism, a good electrical contact is achieved between the detonator block and the contact end plate mechanism. Thus, assembly of the detonator block and the contact end plate mechanism is simplified as no precise alignment of the two parts is required.

In one embodiment, the detonator block 640 connects to a gun 630 as now discussed. The downhole tool 601 shown in FIG. 6 includes a first gun assembly element (e.g., gun 630) having a contact end plate mechanism 632 and a second gun assembly element (e.g., detonator block 640) having two or more spring-loaded contacts 646A, 646B. The two or more spring-loaded contacts 646A, 646B of the second gun assembly element 640 make an electrical contact with to the two or more round electrical contacts 802, 804. In this embodiment, the two or more spring-loaded contacts 646A, 646B maintain the electrical contact with the two or more round electrical contacts 802, 804 while the two or more spring-loaded contacts rotate about a longitudinal axis of the downhole tool.

The contact end plate mechanism 832 shown in FIG. 8 also has a central hole 810, through which the pressure waves from the detonator ballistically communicate with the detonator cord that is attached behind the PCB front face 800 (see FIG. 9). FIG. 8 also shows a bracket 812 that maintains the PCB front face 800 attached to the contact end plate mechanism 632. This feature is better seen in FIG. 9. This figure shows the body 820 of the contact end plate mechanism 632, the PCB front face 800 being in contact with the body 820, and the bracket (or retainer) 812 clipping the PCB front face 800 to the body 820. Optionally, a spring 822 may be placed between the body 820 and the back of the PCB front face 800 to bias it against the detonator block.

FIG. 9 also shows a cord holder 826 that enters through the central hole 810 of the PCB front face 800 and attaches to the body 820 of the contact end plate mechanism 832, for example, with clamps 828. The detonation cord 634 is shown having a bidirectional booster 830 and both the detonation cord and the bidirectional booster attach to an inside the cord holder 826. In this way, the detonation cord is centered relative to the PCB front face and also aligned with the opening 810 so that the pressure waves from the detonator can ignite the bidirectional booster. The bidirectional booster is a more sensitive element for making sure that the pressure waves from the detonator ignite the detonation cord. However, the bidirectional booster is not required and there are guns that do not use such boosters.

On the back of the PCB front face 800, an electrical connector 840 may be attached and this connector electrically connects the three electrical contacts 802, 804, and 806 to corresponding wires 802', 804' and 806' for extending the ground, thru-line and fire-line along the gun assembly 630. FIG. 9 shows the gun assembly 630 having the contact end plate mechanism 632 attached to the charge load tube 636. The charge load tube is used to hold the charges 638 that are detonated in the well for connecting the formation to the interior of the well. The detonation cord 634 actuates these charges and this cord is shown in FIG. 6 being located around the charge load tube 636.

To attach the contact end plate mechanism 632 to the charge load tube 636, one or more clamps 842 may be used. In one application, the one or more clamps 842 may be formed in the body 820 of the contact end plate mechanism 632, as shown in FIG. 9. However, those skilled in the art would understand that other methods and means for attaching the contact end plate mechanism to the charge load tube may be used (e.g., using a twist-lok type of interface). In one application, for example, threads may be formed in the body 820 of the contact end plate mechanism and the charge load tube and the contact end plate mechanism may be screwed to the charge load tube. The clamps shown in FIG. 9 are more advantageous because no twist of the internal wires is produced and also using clamps is cheaper and faster than screwing the contact end plate mechanism.

Figure 10:
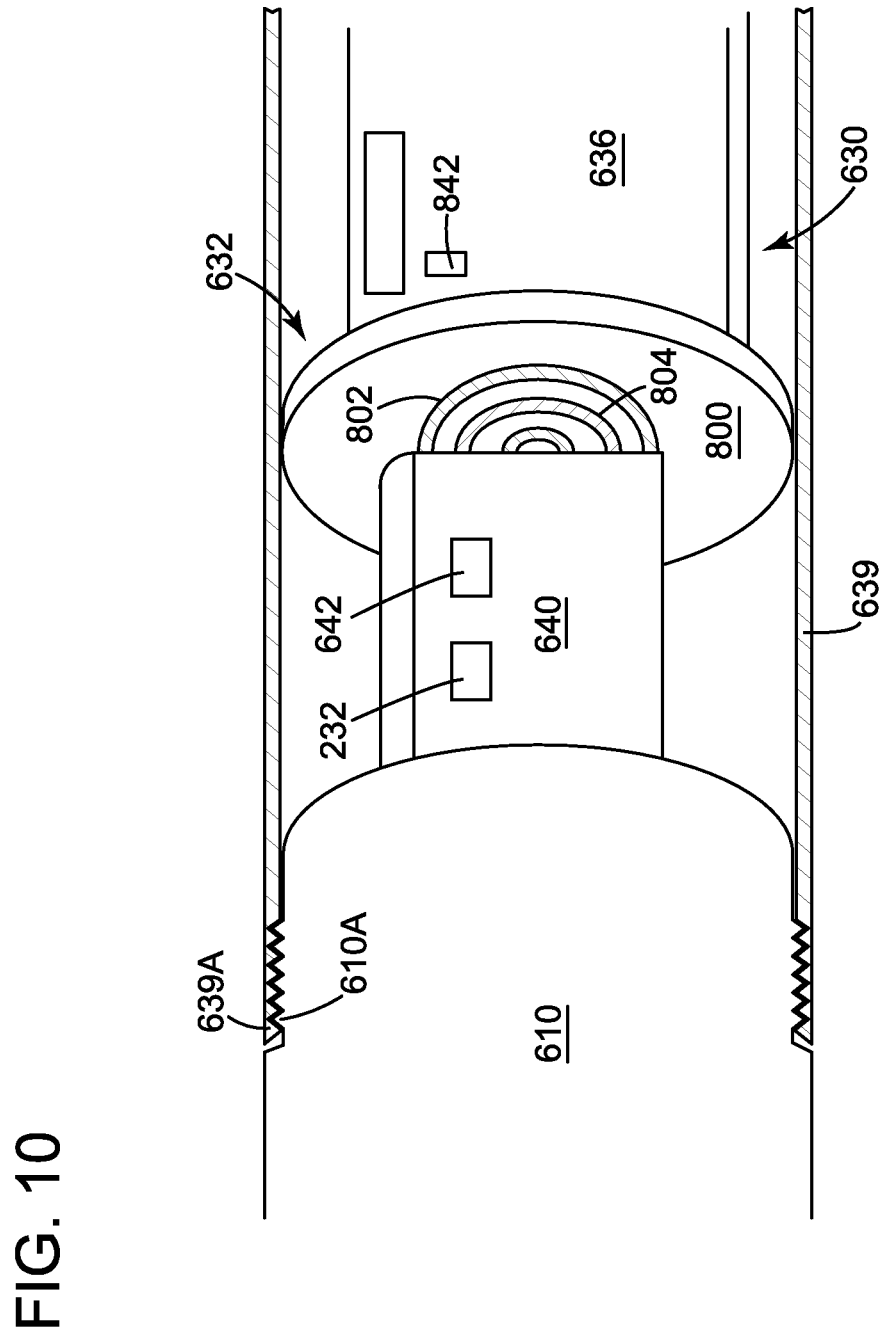
FIG. 10 illustrates a sub connected to a gun assembly through a detonator block.

FIG. 10 shows the detonator block 640 mechanically attached to the first sub 610 and the detonator block 640 also in electrical and mechanical contact with the contact end plate mechanism 632. Note that in another embodiment, first sub 610 can be replaced with another gun assembly. In this embodiment, the detonator block 640 includes a switch assembly 232 and the detonator block is connected between first gun 610 and second gun 630. Those skilled in the art would understand that the switch assembly may be located in the sub 610 instead of the detonator block 640 and only the detonator may be located inside the detonator block. Reference sign 610 indicates in this figure a gun assembly element, which can be a sub, a gun, or other component of the gun assembly. The contact end plate mechanism 632 is already attached to the charge load tube 636 of the gun assembly 630. When the detonator block 640 is mechanically and electrically attached to the contact end plate mechanism 632, as in FIG. 10, the contact switch 650 (if present) touches the contact end plate mechanism, which de-shunts the leads of the detonator 642. In addition, the mechanical contact (if present) between the detonator block and the contact end plate mechanism pushes the interrupter actuator along the axis X, which results in the cap 662 clearing the path between the detonator 642 and the detonator cord 634, i.e., achieving a ballistic communication. Further, when the detonator block 640 is in mechanical contact with the contact end plate mechanism 632, the spring-loaded contacts 646A, 646B, and 646C electrically connect to the contacts 802, 804, and 806 of the contact end plate mechanism 832. Thus, the switch assembly 232 electrically connects to other switch assemblies through circuit board contacts.

As discussed above with regard to FIG. 9, the contact end plate mechanism 632 connects to the charge load tube 636 via snap tabs 842, which are also shown in FIG. 10. The contact end plate mechanism 632 can be made from a variety of materials and with plural manufacturing methods (e.g., injection molding plastic). The contact end plate mechanism 632 and the change load tube 636 are located inside the carrier 639. Carrier 639 connects to the sub 610 by mating threads 639A and 610A at a first end of the carrier. The carrier 639 connects to the second sub 620 (shown in FIG. 6) with corresponding mating threads (not shown) similar to the threads 639A and 610A. Carrier 639 protects the other components of the gun assembly 630 from the fluid present inside the well. Note that the detonation block is screwed to the sub and located outside the sub. Also, in this embodiment, the detonation block is located inside the carrier 639, but outside the change load tube 636.

While the various features illustrated above have been discussed in the context of the oil and gas industry, those skilled in the art would understand that the novel features are applicable to devices in any field. For example, the rotatable multipin connection between the detonator block and the contact end plate mechanism utilizing the printed circuit board as an electromechanical connection may be used in the electronics field. The spring loading of the pins 647A to 647C may account for tolerances in makeup and add practicality to any two elements that need to be electrically connected. Furthermore, the cost of such PCB connector is much below other multipin designs.

Figure 11:
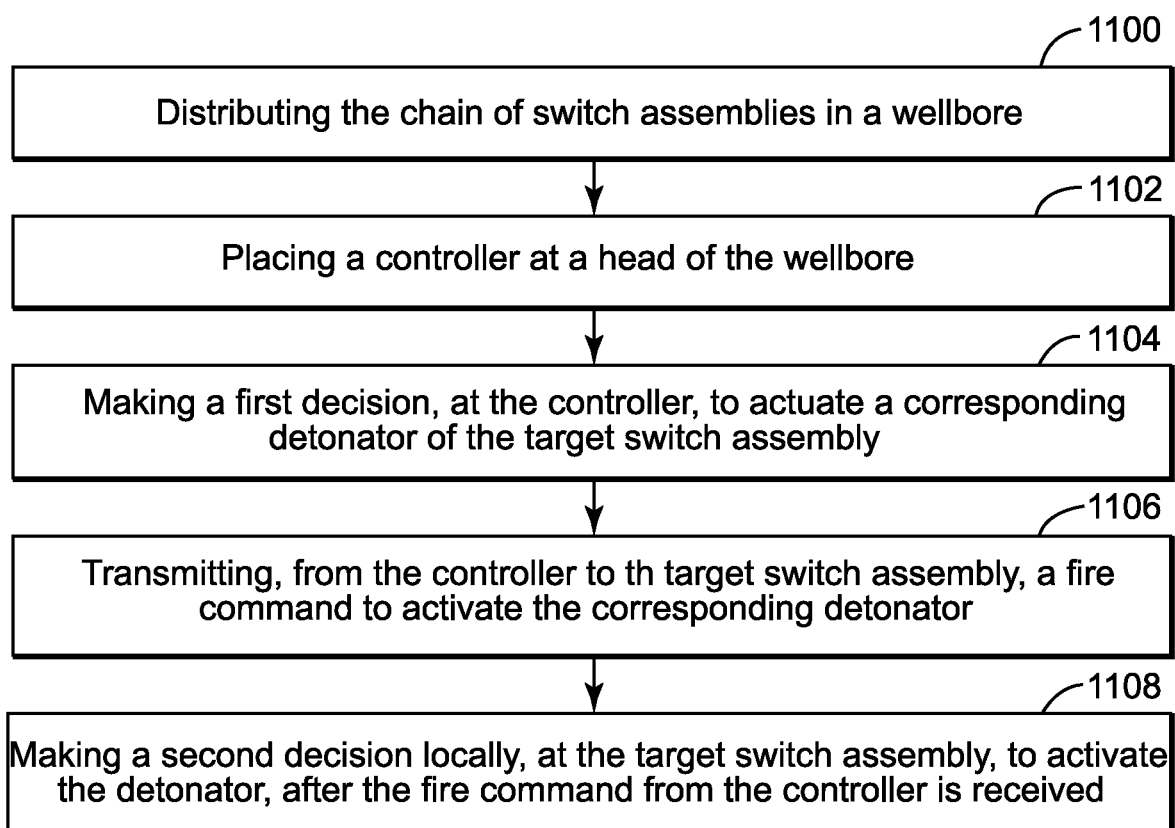
FIG. 11 is a flowchart of a method for actuating a gun detonator.

The various embodiments discussed above may be implemented as now discussed. According to an embodiment illustrated in FIG. 11, there is a method for controlling a target switch assembly 232A in a chain of switch assemblies 232A to 232M (see FIG. 2). The method includes a step 1100 of distributing the chain of switch assemblies in a wellbore 211, a step 1102 of placing a controller at a head of the wellbore, a step 1104 of making a first decision, at the controller, to actuate a corresponding detonator of the target switch assembly, a step 1106 of transmitting, from the controller to the target switch assembly, a fire command to activate the corresponding detonator, and a step 1108 of making a second decision, locally, at the target switch assembly, to activate the detonator, after the fire command from the controller is received.

In this method, each switch assembly of the chain of switch assemblies has a unique digital address. In one application, each switch assembly of the chain of switch assemblies includes a detonator switch and a thru-line switch. In another application, the detonator switch activates the corresponding detonator and the thru-line switch allows a voltage in a thru-line to pass from the target switch assembly to an adjacent switch assembly. The thru-line extends from the controller to the target switch assembly and the fire command is transmitted along the thru-line.

The method may further include a step of measuring a voltage, at the target switch assembly, of a thru-line that extends from the controller to the target switch assembly. When the measured voltage is larger than a threshold voltage, according to this method, the switch assembly actuates the corresponding detonator. The method may also include starting a first timer upon receiving the fire command, where the first timer counts a given first time period. Further, the method may include a step of measuring a voltage, at the target switch assembly, of a thru-line that extends from the controller to the target switch assembly, and when the measured voltage is larger than a threshold voltage, and when the first time period has not lapsed, actuating the corresponding detonator.

The method may also start a second timer when the detonator is actuated. In this case, the method switches off a detonator switch when a second time period of the second timer has elapsed.

Alternatively, the method may include a step of measuring a voltage, at the switch assembly, of a thru-line that extends from the controller to the target switch assembly, and when the measured voltage is larger than a threshold voltage, but the first time period has lapsed, not actuating the corresponding detonator. Another alternative for the method is to measure a voltage, at the target switch assembly, of a thru-line that extends from the controller to the target switch assembly, and, when the measured voltage is not larger than a threshold voltage, to not actuate the corresponding detonator.

According to another variation, the method may start a second timer upon receiving the fire command, where the second timer counts a given second time period, which is shorter than the first time period. According to this variation, the method may include a step of sending status information from the target switch assembly to the controller when the second time period has elapsed.

According to another embodiment, the method may include a step of inserting into the fire command, at the controller, a digital address of the target switch assembly.

A switch assembly 232A that may implement the above method is now discussed. The switch assembly, which is part of a chain of switch assemblies 232A to 232M, includes a communication unit (CU) that is configured to receive, from an external controller 206, a fire command to activate a detonator 230A; and a computing core (CC) configured to locally make a decision to activate the detonator 230A, based on (i) a measured parameter (V), (ii) a threshold value of the measured parameter (V), and (iii) the fire command.

The switch assembly may also include a detonator switch electrically connected to the detonator, a thru-line switch connected to a thru-line that extends to the external controller, a voltage measurement unit for measuring the parameter, where the parameter is a voltage of the thru-line, and a permanent memory that stores a unique digital address.

In one embodiment, the switch assembly may also include a first timer which is started upon receiving the fire command, where the first timer counts a given first time period. The switch assembly may also include a second timer which is also started upon receiving the fire command, where the second timer counts a given second time period, which is shorter than the given first time period.

The method discussed above with regard to FIG. 11 may be implemented in a downhole system 600 (as illustrated in FIG. 6). Such a system may include a controller 206 located at the surface; a gun string 601 located in a wellbore 211, the gun string 601 including plural gun assemblies 630; a thru-line 210 connecting the controller 206 to the gun string 601; and a detonator block 640 attached to a given gun assembly 630. The detonator block 640 includes an addressable switch assembly 232.

This system may further include a detonator 642 electrically connected to the switch assembly 232. The detonator may be located inside the detonator block. The system may also include a sub connected to an end of the detonator block, which is opposite to the gun assembly. The gun assembly includes an end plate mechanism 632 that electrically connects to the detonator block.

In one application, the detonator block has at least one spring-loaded contact connected to the thru-line and the end plate mechanism 632 includes a round electrical contact 806 made as a printed circuit board, and the spring-loaded contact touches the printed circuit board. In one application, the printed circuit board is circular.

Figure 12:
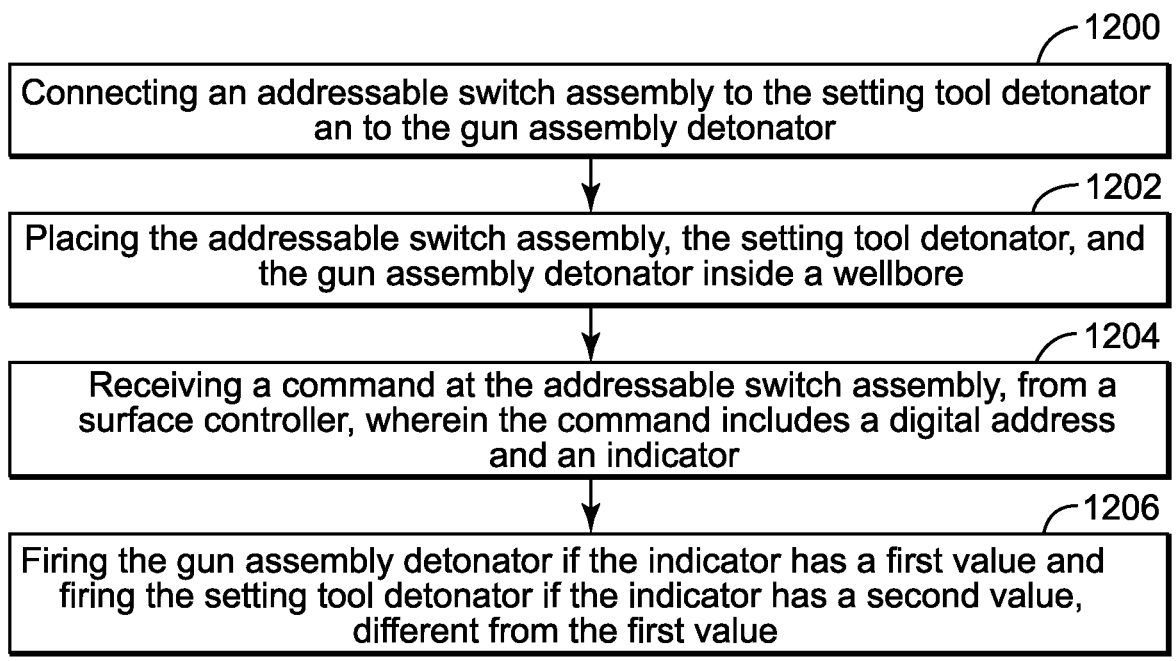
FIG. 12 is another flowchart of a method for actuating a gun assembly detonator and a setting tool detonator.

According to another embodiment, there is a method, as illustrated in FIG. 12, for selectively firing a setting tool detonator 250 and a gun assembly detonator 230M. The method includes a step 1200 of connecting an addressable switch assembly 232M to the setting tool detonator 250 and to the gun assembly detonator, a step 1202 of placing the addressable switch assembly 232M, the setting tool detonator 250, and the gun assembly detonator 230M inside a wellbore, a step 1204 of receiving a command at the addressable switch assembly, from a surface controller 206, wherein the command includes a digital address and an indicator, and a step 1206 of firing the gun assembly detonator 230M if the indicator has a first value and firing the setting tool detonator 250 if the indicator has a second value, different from the first value.

The indicator takes only the first or second values. In one application, the switch assembly decides locally to activate the setting tool detonator 250, after receiving the command. In another application, the switch assembly decides locally to activate the gun assembly detonator 230M, after receiving the command. The first value is fire and the second value is set.

The method may further include a step of measuring a voltage, at the switch assembly, of a thru-line that extends from the controller to the switch assembly. In one application, the method includes, when the measured voltage is larger than a threshold voltage and the indicator has the first value, actuating the gun assembly detonator. Alternatively, the method may include, when the measured voltage is larger than a threshold voltage and the indicator has the second value, actuating the setting tool detonator. In one application, the method starts a first timer upon receiving the command, where the first timer counts a given first time period.

The method may further include a step of measuring a voltage, at the switch assembly, of a thru-line that extends from the controller to the switch assembly; and, when the measured voltage is larger than a threshold voltage, the first time period has not lapsed, and the indicator has the first value, actuating the gun assembly detonator.

In one application, the method measures a voltage, at the switch assembly, of a thru-line that extends from the controller to the switch assembly; and when the measured voltage is larger than a threshold voltage, the first time period has not lapsed, and the indicator has the second value, actuating the setting tool detonator. In one embodiment, the method starts a second timer when the gun assembly detonator or the setting tool detonator is actuated.

The method may also include a step of switching off a detonator switch when a second time period of the second timer has elapsed, and/or starting a second timer upon receiving the command, wherein the second timer counts a given second time period, which is shorter than the first time period. In still another application, the method may include a step of sending status information from the switch assembly to the controller when the second time period has elapsed.

The method discussed above with regard to FIG. 12 may be implemented in a switch assembly 232M, which is part of a chain of switch assemblies 232A to 232M. The switch assembly includes a communication unit (CU) configured to receive, from an external controller 206, a command to activate a gun assembly detonator 230M or a setting tool detonator 250, and a computing core (CC) configured to locally make a decision to activate one of the gun assembly detonator 230M or the setting tool detonator 250, based on (i) a measured parameter (V), (ii) a threshold value of the measured parameter (V), and (iii) the received command.

The switch assembly may also include a first switch electrically connected to the gun assembly detonator; and a second switch electrically connected to the setting tool detonator. The switch assembly may further include a thru-line switch connected to a thru-line that extends to the external controller, and a voltage measurement unit for measuring the parameter. The parameter is a voltage of the thru-line. The switch assembly may further include a permanent memory that stores a unique digital address, and a first timer which is started upon receiving the command. The first timer counts a given first time period. If the switch assembly includes a second timer, which is also started upon receiving the command, the second timer counts a given second time period, which is shorter than the given first time period.

The method discussed above may also be implemented in a downhole system 600 as illustrated in FIG. 6. The downhole includes a controller 206 located at the surface; a gun string 601 located in a wellbore 211, the gun string 601 including plural gun assemblies 630 and a setting tool 202, a thru-line 210 connecting the controller 206 to the gun string 601, and at least an addressable switch assembly 232 configured to actuate a gun assembly detonator 642 and a setting tool detonator 250. The system may further include a detonator block 640 located adjacent to a gun assembly 630, where both the addressable switch assembly and the gun assembly detonator are located inside the detonator block. In one application, the system includes a sub connected to an end of the detonator block, which is opposite to the gun assembly. The gun assembly includes an end plate mechanism 632 that electrically connects to the detonator block. In this application, the detonator block has at least one spring-loaded contact connected to the thru-line and the end plate mechanism 632 includes a round electrical contact 806 made as a printed circuit board, and the spring-loaded contact touches the printed circuit board.

The disclosed embodiments provide methods and systems for selectively actuating one or more gun assemblies in a gun string. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A downhole system comprising:
a controller located at the surface;
a gun string located in a wellbore, the gun string including plural gun assemblies;
a thru-line connecting the controller to the gun string; and
a detonator block attached to a given gun assembly, wherein the detonator block includes an addressable switch assembly, wherein the gun assembly includes an end plate mechanism that electrically connects to the detonator block, and wherein the detonator block has at least one spring-loaded contact connected to the thru-line and the end plate mechanism includes a round electrical contact made as a printed circuit board, and the spring-loaded contact touches the printed circuit board.

2. The system of claim 1, further comprising:
a detonator electrically connected to the switch assembly.

3. The system of claim 2, wherein the detonator is located inside the detonator block.

4. The system of claim 1, further comprising:
a sub connected to an end of the detonator block, which is opposite to the gun assembly.

5. The system of claim 1, wherein the printed circuit board is circular.

6. A downhole system comprising:
a controller located at the surface;
a gun string located in a wellbore, the gun string including plural gun assemblies and a setting tool;
a thru-line connecting the controller to the gun string; and
at least an addressable switch assembly configured to actuate a gun assembly detonator and a setting tool detonator,
wherein a gun assembly of the plural gun assemblies includes an end plate mechanism that electrically connects to a detonator block, and
wherein the detonator block has at least one spring-loaded contact connected to the thru-line and the end plate mechanism includes a round electrical contact made as a printed circuit board, and the spring-loaded contact touches the printed circuit board.

7. The system of claim 6, further comprising:
the detonator block located adjacent to the gun assembly, wherein both the addressable switch assembly and the gun assembly detonator are located inside the detonator block.

8. The system of claim 7, further comprising:
a sub connected to an end of the detonator block, which is opposite to the gun assembly.

9. The system of claim 6, wherein the printed circuit board is circular.

10. A downhole system comprising:
a gun string including plural gun assemblies; and
a detonator block attached to a given gun assembly,
wherein the detonator block includes an addressable switch assembly,
wherein the gun assembly includes an end plate mechanism that electrically connects to the detonator block, and
wherein the detonator block has at least one spring-loaded contact configured to be connected to a thru-line, and the end plate mechanism includes a round electrical contact made as a printed circuit board, and the spring-loaded contact touches the printed circuit board.

11. The system of claim 10, further comprising:
the thru-line connecting to the gun string; and
a controller located at the surface and connected to the thru-line.

12. The system of claim 10, further comprising:
a detonator electrically connected to the addressable switch assembly.

13. The system of claim 12, wherein the detonator is located inside the detonator block.

14. The system of claim 10, further comprising:
a sub connected to an end of the detonator block, which is opposite to the gun assembly.

15. The system of claim 10, wherein the printed circuit board is circular.

* * * * *